(12) United States Patent
Adib et al.

(10) Patent No.: US 11,331,692 B2
(45) Date of Patent: May 17, 2022

(54) METHODS FOR TREATING A SUBSTRATE AND METHOD FOR MAKING ARTICLES COMPRISING BONDED SHEETS

(71) Applicant: CORNING INCORPORATED, Corning, NY (US)

(72) Inventors: Kaveh Adib, Corning, NY (US); Robert Alan Bellman, Ithaca, NY (US); Dae youn Kim, Cheonan-si (KR); Robert George Manley, Vestal, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/771,044

(22) PCT Filed: Dec. 13, 2018

(86) PCT No.: PCT/US2018/065330
§ 371 (c)(1),
(2) Date: Jun. 9, 2020

(87) PCT Pub. No.: WO2019/118660
PCT Pub. Date: Jun. 20, 2019

(65) Prior Publication Data
US 2021/0187546 A1    Jun. 24, 2021

Related U.S. Application Data

(60) Provisional application No. 62/599,348, filed on Dec. 15, 2017.

(51) Int. Cl.
*B05D 1/00* (2006.01)
*B05D 3/04* (2006.01)
*B05D 5/08* (2006.01)

(52) U.S. Cl.
CPC ............ *B05D 1/62* (2013.01); *B05D 3/0433* (2013.01); *B05D 3/0486* (2013.01); *B05D 5/083* (2013.01); *B05D 2203/35* (2013.01)

(58) Field of Classification Search
None
See application file for complete search history.

(56) References Cited

U.S. PATENT DOCUMENTS 3,722,181 A    3/1973   Kirkland et al.
4,096,315 A    6/1978   Kubacki
(Continued)

FOREIGN PATENT DOCUMENTS

CN    101916022 A    12/2010
CN    101924067 A    12/2010
(Continued)

OTHER PUBLICATIONS

Morita et al; "Applications of Plasma Polymerization"; Pure & Appl. Chem., vol. 57, No. 9 pp. 1277-1286 (1985).
(Continued)

*Primary Examiner* — Shamim Ahmed
*Assistant Examiner* — Bradford M Gates

(57) ABSTRACT

Described herein are articles and methods of making articles, for example glass articles, including a sheet and a carrier, wherein the sheet and carrier are bonded together using a coating layer, which is, for example, a fluorocarbon polymer coating layer, and associated deposition methods and inert gas treatments that may be applied on the sheet, the carrier, or both, to control the fluorine content of the coating layer and van der Waals, hydrogen and covalent bonding between the sheet and the carrier. The coating layer bonds the sheet and carrier together with sufficient bond strength to prevent delamination of the sheet and the carrier during high temperature processing to while preventing a permanent
(Continued)

bond at during high temperature processing while at the same time maintaining a sufficient bond to prevent delamination during high temperature processing.

19 Claims, 5 Drawing Sheets

(56) References Cited

U.S. PATENT DOCUMENTS

| | | | |
|---|---|---|---|
| 4,179,324 A | 12/1979 | Kirkpatrick |
| 4,397,722 A | 8/1983 | Haller |
| 4,599,243 A | 7/1986 | Sachdev et al. |
| 4,599,266 A | 7/1986 | Nakayama et al. |
| 4,810,326 A | 3/1989 | Babu et al. |
| 4,822,466 A | 4/1989 | Rabalais et al. |
| 4,849,284 A | 7/1989 | Arthur et al. |
| 4,990,462 A | 2/1991 | Sliwa, Jr. |
| 5,073,181 A | 12/1991 | Foster et al. |
| 5,141,800 A | 8/1992 | Effenberger et al. |
| 5,222,494 A | 6/1993 | Baker, Jr. |
| 5,357,726 A | 10/1994 | Effenberger et al. |
| 5,413,940 A | 5/1995 | Lin et al. |
| 5,462,781 A | 10/1995 | Zukowski |
| 5,479,043 A | 12/1995 | Nuyen |
| 5,482,896 A | 1/1996 | Tang |
| 5,491,571 A | 2/1996 | Williams et al. |
| 5,554,680 A | 9/1996 | Ojakaar |
| 5,616,179 A | 4/1997 | Baldwin et al. |
| 5,661,618 A | 8/1997 | Brown et al. |
| 5,718,967 A | 2/1998 | Hu et al. |
| 5,755,867 A | 5/1998 | Chikuni et al. |
| 5,820,991 A | 10/1998 | Cabo |
| 5,840,616 A | 11/1998 | Sakaguchi et al. |
| 5,888,591 A | 3/1999 | Gleason et al. |
| 5,904,791 A | 5/1999 | Bearinger et al. |
| 5,966,622 A | 10/1999 | Levine et al. |
| 5,972,152 A | 10/1999 | Lake et al. |
| 6,037,026 A | 3/2000 | Iwamoto |
| 6,091,478 A | 7/2000 | Tanaka et al. |
| 6,124,154 A | 9/2000 | Miyasaka |
| 6,159,385 A | 12/2000 | Yao et al. |
| 6,261,398 B1 | 7/2001 | Costa |
| 6,338,901 B1 | 1/2002 | Veerasamy |
| 6,379,746 B1 | 4/2002 | Birch et al. |
| 6,387,736 B1 | 5/2002 | Cao et al. |
| 6,521,511 B1 | 2/2003 | Inoue et al. |
| 6,521,857 B1 | 2/2003 | Barnett |
| 6,528,145 B1 | 3/2003 | Berger et al. |
| 6,540,866 B1 | 4/2003 | Zhang et al. |
| 6,602,606 B1 | 8/2003 | Fujisawa et al. |
| 6,645,828 B1 | 11/2003 | Farrens et al. |
| 6,649,540 B2 | 11/2003 | Wang et al. |
| 6,687,969 B1 | 2/2004 | Dando |
| 6,699,798 B2 | 3/2004 | Rockford |
| 6,735,982 B2 | 5/2004 | Matthies |
| 6,762,074 B1 | 7/2004 | Draney et al. |
| 6,814,833 B2 | 11/2004 | Sabia |
| 6,815,070 B1 | 11/2004 | Buerkle et al. |
| 6,969,166 B2 | 11/2005 | Clark et al. |
| 6,974,731 B2 | 12/2005 | Yamazaki et al. |
| 6,992,371 B2 | 1/2006 | Mancini et al. |
| 7,041,608 B2 | 5/2006 | Sieber et al. |
| 7,045,878 B2 | 5/2006 | Faris |
| 7,056,751 B2 | 6/2006 | Faris |
| 7,060,323 B2 | 6/2006 | Sugahara et al. |
| 7,118,990 B1 | 10/2006 | Xu et al. |
| 7,129,311 B2 | 10/2006 | Teff et al. |
| 7,144,638 B2 | 12/2006 | Leung et al. |
| 7,147,740 B2 | 12/2006 | Takayama et al. |
| 7,166,520 B1 | 1/2007 | Henley |
| 7,220,656 B2 | 5/2007 | Forbes |
| 7,232,739 B2 | 6/2007 | Kerdiles et al. |
| 7,261,793 B2 | 8/2007 | Chen et al. |
| 7,351,300 B2 | 4/2008 | Takayama et al. |
| 7,364,942 B2 | 4/2008 | Martin |
| 7,407,867 B2 | 8/2008 | Ghyselen et al. |
| 7,408,006 B2 | 8/2008 | Comino et al. |
| 7,466,390 B2 | 12/2008 | French et al. |
| 7,482,249 B2 | 1/2009 | Jakob et al. |
| 7,531,590 B2 | 5/2009 | Teff et al. |
| 7,541,264 B2 | 6/2009 | Gardner et al. |
| 7,574,787 B2 | 8/2009 | Xu et al. |
| 7,575,983 B2 | 8/2009 | Hu et al. |
| 7,635,617 B2 | 12/2009 | Yamazaki |
| 7,642,559 B2 | 1/2010 | Yamazaki et al. |
| 7,737,035 B1 | 6/2010 | Lind et al. |
| 7,741,775 B2 | 6/2010 | Yamazaki et al. |
| 7,749,862 B2 | 7/2010 | Schwarzenbach et al. |
| 7,763,365 B2 | 7/2010 | Takeuchi et al. |
| 7,842,548 B2 | 11/2010 | Lee et al. |
| 7,902,038 B2 | 3/2011 | Aspar et al. |
| 7,909,928 B2 | 3/2011 | Lahann et al. |
| 7,939,425 B2 | 5/2011 | Hu et al. |
| 7,960,840 B2 | 6/2011 | Bonifield et al. |
| 7,960,916 B2 | 6/2011 | Kawachi |
| 7,978,282 B2 | 7/2011 | An et al. |
| 7,989,314 B2 | 8/2011 | Lee et al. |
| 8,012,667 B2 | 9/2011 | Nam et al. |
| 8,034,206 B2 | 10/2011 | Kim et al. |
| 8,034,452 B2 | 10/2011 | Padiyath et al. |
| 8,043,697 B2 | 10/2011 | Murakami et al. |
| 8,048,794 B2 | 11/2011 | Knickerbocker |
| 8,069,229 B2 | 11/2011 | Yellapragada et al. |
| 8,105,935 B2 | 1/2012 | Ohara et al. |
| 8,138,614 B2 | 3/2012 | Yamazaki et al. |
| 8,173,249 B2 | 5/2012 | Leu et al. |
| 8,211,259 B2 | 7/2012 | Sato et al. |
| 8,211,270 B2 | 7/2012 | Suzuki et al. |
| 8,236,669 B2 | 8/2012 | Hong et al. |
| 8,268,939 B2 | 9/2012 | Ebbrecht et al. |
| 8,349,727 B2 | 1/2013 | Guo et al. |
| 8,383,460 B1 | 2/2013 | Yim |
| 8,399,047 B2 | 3/2013 | Lahann et al. |
| 8,580,069 B2 | 11/2013 | Watanabe et al. |
| 8,590,688 B2 | 11/2013 | Weigl |
| 8,609,229 B2 | 12/2013 | Kondo |
| 8,656,735 B2 | 2/2014 | Tamitsuji et al. |
| 8,660,052 B2 | 2/2014 | Liang et al. |
| 8,697,228 B2 | 4/2014 | Carre et al. |
| 8,697,728 B2 | 4/2014 | Ashrafian et al. |
| 8,822,306 B2 | 9/2014 | Berger et al. |
| 8,840,999 B2 | 9/2014 | Harimoto et al. |
| 8,993,706 B2 | 3/2015 | Schubert et al. |
| 8,995,146 B2 | 3/2015 | Brooks et al. |
| 9,069,133 B2 | 6/2015 | Baldwin et al. |
| 9,111,981 B2 | 8/2015 | Flaim et al. |
| 9,131,587 B2 | 9/2015 | Zhou |
| 9,269,826 B2 | 2/2016 | Hosono et al. |
| 9,612,455 B2 | 4/2017 | Nicolson et al. |
| 9,805,941 B2 | 10/2017 | Kanarik et al. |
| 9,889,635 B2 | 2/2018 | Bellman et al. |
| 10,046,542 B2 | 8/2018 | Adib et al. |
| 10,086,584 B2 | 10/2018 | Bellman et al. |
| 10,543,662 B2 | 1/2020 | Bellman et al. |
| 2001/0045351 A1 | 11/2001 | Koh et al. |
| 2002/0171080 A1 | 11/2002 | Faris |
| 2003/0017303 A1 | 1/2003 | Shindo et al. |
| 2003/0020049 A1 | 1/2003 | Payne et al. |
| 2003/0020062 A1 | 1/2003 | Faris |
| 2003/0057563 A1 | 3/2003 | Nathan et al. |
| 2003/0119336 A1 | 6/2003 | Matsuki et al. |
| 2003/0175525 A1 | 9/2003 | Wochnowski et al. |
| 2003/0210853 A1 | 11/2003 | Kato |
| 2003/0228413 A1 | 12/2003 | Ohta et al. |
| 2004/0033358 A1 | 2/2004 | Coates et al. |
| 2004/0044100 A1 | 3/2004 | Schlenoff et al. |
| 2004/0217352 A1 | 11/2004 | Forbes |
| 2004/0222500 A1 | 11/2004 | Aspar et al. |
| 2004/0247949 A1 | 12/2004 | Akedo et al. |
| 2004/0248378 A1 | 12/2004 | Ghyselen et al. |
| 2004/0258850 A1 | 12/2004 | Straccia et al. |
| 2005/0001201 A1 | 1/2005 | Bocko et al. |
| 2005/0029224 A1 | 2/2005 | Aspar et al. |
| 2005/0059218 A1 | 3/2005 | Faris |

(56) References Cited

U.S. PATENT DOCUMENTS

| | | |
|---|---|---|
| 2005/0069713 A1 | 3/2005 | Gupta et al. |
| 2005/0081993 A1 | 4/2005 | Ilkka et al. |
| 2005/0118595 A1 | 6/2005 | Lahann |
| 2005/0118742 A1 | 6/2005 | Henning et al. |
| 2005/0136188 A1* | 6/2005 | Chang ............... H01J 37/32477 427/421.1 |
| 2005/0175851 A1 | 8/2005 | Bordunov et al. |
| 2005/0224155 A1 | 10/2005 | Chen et al. |
| 2005/0242341 A1 | 11/2005 | Knudson et al. |
| 2006/0091104 A1 | 5/2006 | Takeshita et al. |
| 2006/0134362 A1 | 6/2006 | Lu et al. |
| 2006/0165975 A1 | 7/2006 | Moser et al. |
| 2006/0166464 A1 | 7/2006 | Jakob et al. |
| 2006/0192205 A1 | 8/2006 | Yamazaki et al. |
| 2006/0246218 A1 | 11/2006 | Bienkiewicz et al. |
| 2006/0250559 A1 | 11/2006 | Bocko et al. |
| 2006/0264004 A1 | 11/2006 | Tong et al. |
| 2007/0048530 A1 | 3/2007 | Tsao et al. |
| 2007/0077353 A1 | 4/2007 | Lee et al. |
| 2007/0077728 A1 | 4/2007 | Kulkarni et al. |
| 2007/0077782 A1 | 4/2007 | Lee et al. |
| 2007/0091062 A1 | 4/2007 | French et al. |
| 2007/0105252 A1 | 5/2007 | Lee et al. |
| 2007/0105339 A1 | 5/2007 | Faris |
| 2007/0111391 A1 | 5/2007 | Aoki et al. |
| 2007/0134784 A1 | 6/2007 | Halverson et al. |
| 2007/0181938 A1 | 8/2007 | Bucher et al. |
| 2007/0248809 A1 | 10/2007 | Haldeman et al. |
| 2008/0044588 A1 | 2/2008 | Sakhrani |
| 2008/0053959 A1 | 3/2008 | Tong et al. |
| 2008/0090380 A1 | 4/2008 | Gardner et al. |
| 2008/0111786 A1 | 5/2008 | Goudarzi |
| 2008/0135175 A1 | 6/2008 | Higuchi |
| 2008/0173992 A1 | 7/2008 | Mahler et al. |
| 2008/0212000 A1 | 9/2008 | French et al. |
| 2008/0309867 A1 | 12/2008 | Kampstra |
| 2009/0020414 A1 | 1/2009 | Tsao et al. |
| 2009/0091025 A1 | 4/2009 | Wong et al. |
| 2009/0110882 A1 | 4/2009 | Higuchi |
| 2009/0126404 A1 | 5/2009 | Sakhrani et al. |
| 2009/0133820 A1 | 5/2009 | Sato et al. |
| 2009/0218560 A1 | 9/2009 | Flaim et al. |
| 2009/0227074 A1 | 9/2009 | Hong et al. |
| 2009/0261062 A1 | 10/2009 | Kim |
| 2009/0262294 A9 | 10/2009 | Templier et al. |
| 2009/0266471 A1 | 10/2009 | Kim et al. |
| 2009/0321005 A1 | 12/2009 | Higuchi et al. |
| 2010/0018505 A1 | 1/2010 | Ma et al. |
| 2010/0038023 A1 | 2/2010 | Kho et al. |
| 2010/0089096 A1 | 4/2010 | Tamitsuji et al. |
| 2010/0101719 A1 | 4/2010 | Otsuka et al. |
| 2010/0151231 A1 | 6/2010 | Matsuo et al. |
| 2010/0187980 A1 | 7/2010 | Langer et al. |
| 2010/0224320 A1 | 9/2010 | Tsai et al. |
| 2010/0308014 A1* | 12/2010 | Cheshire ........... H01L 21/30655 216/37 |
| 2010/0316871 A1 | 12/2010 | Fujiwara et al. |
| 2011/0001251 A1 | 1/2011 | Gou et al. |
| 2011/0002636 A1 | 1/2011 | Ando et al. |
| 2011/0010905 A1 | 1/2011 | Sturzebecher |
| 2011/0012873 A1 | 1/2011 | Prest et al. |
| 2011/0024166 A1 | 2/2011 | Chang et al. |
| 2011/0026236 A1 | 2/2011 | Kondo et al. |
| 2011/0042649 A1 | 2/2011 | Duvall et al. |
| 2011/0045239 A1 | 2/2011 | Takaya et al. |
| 2011/0048611 A1 | 3/2011 | Carre et al. |
| 2011/0064953 A1 | 3/2011 | O'Rourke et al. |
| 2011/0069467 A1 | 3/2011 | Flaim et al. |
| 2011/0092006 A1 | 4/2011 | An et al. |
| 2011/0102346 A1 | 5/2011 | Orsley et al. |
| 2011/0111194 A1 | 5/2011 | Carre et al. |
| 2011/0123787 A1 | 5/2011 | Tomamoto et al. |
| 2011/0170991 A1 | 7/2011 | Weigl |
| 2011/0207328 A1 | 8/2011 | Speakman |
| 2011/0227086 A1 | 9/2011 | French |
| 2011/0250427 A1 | 10/2011 | Kotov et al. |
| 2011/0256385 A1 | 10/2011 | Matsuzaki et al. |
| 2011/0272090 A1 | 11/2011 | Higuchi |
| 2011/0304794 A1 | 12/2011 | Noh et al. |
| 2011/0308739 A1 | 12/2011 | McCutcheon et al. |
| 2011/0311789 A1 | 12/2011 | Loy et al. |
| 2011/0318544 A1 | 12/2011 | Chen et al. |
| 2011/0318589 A1 | 12/2011 | Pignatelli et al. |
| 2012/0009703 A1 | 1/2012 | Feinstein et al. |
| 2012/0034437 A1 | 2/2012 | Puligadda et al. |
| 2012/0035309 A1 | 2/2012 | Zhu et al. |
| 2012/0045611 A1 | 2/2012 | Shih et al. |
| 2012/0052654 A1 | 3/2012 | Yang et al. |
| 2012/0061881 A1 | 3/2012 | Bae et al. |
| 2012/0063952 A1 | 3/2012 | Hong et al. |
| 2012/0080403 A1 | 4/2012 | Tomamoto et al. |
| 2012/0083098 A1 | 4/2012 | Berger et al. |
| 2012/0107978 A1 | 5/2012 | Shin et al. |
| 2012/0118478 A1 | 5/2012 | Park et al. |
| 2012/0132885 A1 | 5/2012 | Lippert et al. |
| 2012/0135187 A1 | 5/2012 | Takimoto et al. |
| 2012/0153496 A1 | 6/2012 | Lee et al. |
| 2012/0156457 A1 | 6/2012 | Kondo |
| 2012/0156480 A1 | 6/2012 | Kondo et al. |
| 2012/0171454 A1 | 7/2012 | Kondo |
| 2012/0193029 A1 | 8/2012 | Fay et al. |
| 2012/0202010 A1 | 8/2012 | Uchida |
| 2012/0202030 A1 | 8/2012 | Kondo et al. |
| 2012/0223049 A1 | 9/2012 | Yoshikawa et al. |
| 2012/0228617 A1 | 9/2012 | Ko et al. |
| 2012/0235315 A1 | 9/2012 | Wu et al. |
| 2012/0258320 A1 | 10/2012 | Berger |
| 2012/0272800 A1 | 11/2012 | Lacan et al. |
| 2012/0276689 A1 | 11/2012 | Canale et al. |
| 2012/0315470 A1 | 12/2012 | Hanaki et al. |
| 2012/0329249 A1 | 12/2012 | Ahn et al. |
| 2013/0037960 A1 | 2/2013 | Sadaka et al. |
| 2013/0115441 A1 | 5/2013 | Bookbinder et al. |
| 2013/0188324 A1 | 7/2013 | Lee et al. |
| 2013/0192574 A1 | 8/2013 | Maeda |
| 2013/0192754 A1 | 8/2013 | Dukkipati et al. |
| 2013/0203265 A1 | 8/2013 | Hsiao |
| 2013/0209731 A1 | 8/2013 | Nattermann et al. |
| 2013/0230265 A1 | 9/2013 | Hubbard et al. |
| 2013/0239617 A1 | 9/2013 | Dannoux |
| 2013/0270533 A1 | 10/2013 | Crispin et al. |
| 2013/0280495 A1 | 10/2013 | Matsumoto |
| 2014/0050911 A1 | 2/2014 | Mauro et al. |
| 2014/0106141 A1 | 4/2014 | Bellman et al. |
| 2014/0106150 A1 | 4/2014 | Decker et al. |
| 2014/0130969 A1 | 5/2014 | McCutcheon et al. |
| 2014/0150244 A1 | 6/2014 | Liu et al. |
| 2014/0165654 A1 | 6/2014 | Bellman et al. |
| 2014/0166199 A1 | 6/2014 | Bellman et al. |
| 2014/0170378 A1 | 6/2014 | Bellman et al. |
| 2014/0210075 A1 | 7/2014 | Lee et al. |
| 2014/0220327 A1 | 8/2014 | Adib et al. |
| 2014/0295590 A1 | 10/2014 | Oh et al. |
| 2015/0060869 A1 | 3/2015 | Ro et al. |
| 2015/0060870 A1 | 3/2015 | Ro et al. |
| 2015/0086794 A1 | 3/2015 | Akita et al. |
| 2015/0099110 A1 | 4/2015 | Bellman et al. |
| 2015/0102498 A1 | 4/2015 | Enicks et al. |
| 2015/0266276 A1 | 9/2015 | Vissing et al. |
| 2015/0306847 A1 | 10/2015 | Bellman et al. |
| 2015/0329415 A1 | 11/2015 | Bellman et al. |
| 2016/0009958 A1 | 1/2016 | Moore et al. |
| 2016/0017196 A1 | 1/2016 | Moore et al. |
| 2016/0035764 A1 | 2/2016 | Watts |
| 2016/0083835 A1 | 3/2016 | Adib et al. |
| 2016/0211803 A1* | 7/2016 | Ji ........................... G01R 33/06 |
| 2016/0329415 A1 | 11/2016 | He et al. |
| 2017/0036419 A1 | 2/2017 | Adib et al. |
| 2017/0182744 A1 | 6/2017 | Bellman et al. |
| 2017/0320771 A1 | 11/2017 | Adib et al. |
| 2018/0126705 A1 | 5/2018 | Adib et al. |

(56) References Cited

U.S. PATENT DOCUMENTS

2018/0269071 A1* 9/2018 Le .................. H01L 21/31116
2018/0297324 A1 10/2018 Adib et al.

FOREIGN PATENT DOCUMENTS

| | | |
|---|---|---|
| CN | 102034746 A | 4/2011 |
| CN | 102070120 A | 5/2011 |
| CN | 102789125 A | 11/2012 |
| CN | 102815052 A | 12/2012 |
| CN | 102820262 A | 12/2012 |
| CN | 103042803 A | 4/2013 |
| DE | 10034737 A1 | 2/2002 |
| DE | 10323303 A1 | 4/2004 |
| DE | 10323304 A1 | 4/2004 |
| DE | 10353530 A1 | 6/2005 |
| EP | 0737258 A1 | 10/1996 |
| EP | 1628339 A1 | 2/2006 |
| EP | 1914066 A1 | 4/2008 |
| EP | 2025650 A1 | 2/2009 |
| EP | 2128105 A1 | 12/2009 |
| EP | 2270865 A2 | 1/2011 |
| EP | 2273475 A1 | 1/2011 |
| EP | 2398040 A1 | 12/2011 |
| EP | 2331436 B1 | 12/2012 |
| FR | 2893750 A1 | 5/2007 |
| GB | 1082116 A | 9/1967 |
| GB | 1373359 A | 11/1974 |
| GB | 1373559 A | 11/1974 |
| GB | 1583544 A | 1/1981 |
| GB | 2481187 A | 12/2011 |
| IN | 200906585 | 5/2015 |
| JP | 05-096235 A | 4/1993 |
| JP | 05-111620 A | 5/1993 |
| JP | 2000-241804 A | 9/2000 |
| JP | 2002-348150 A | 12/2002 |
| JP | 2003-071937 A | 3/2003 |
| JP | 2003-077187 A | 3/2003 |
| JP | 2004-066664 A | 3/2004 |
| JP | 2004-178891 A | 6/2004 |
| JP | 2005-014599 A | 1/2005 |
| JP | 2005-300972 A | 10/2005 |
| JP | 2006-003684 A | 1/2006 |
| JP | 2007-138144 A | 6/2007 |
| JP | 4036018 B2 | 1/2008 |
| JP | 2008-072087 A | 3/2008 |
| JP | 2008-123948 A | 5/2008 |
| JP | 2009-028922 A | 2/2009 |
| JP | 2009-028923 A | 2/2009 |
| JP | 2009-074002 A | 4/2009 |
| JP | 2009-131732 A | 6/2009 |
| JP | 2009-184172 A | 8/2009 |
| JP | 2009-283155 A | 12/2009 |
| JP | 2010-018505 A | 1/2010 |
| JP | 2010-167484 A | 8/2010 |
| JP | 2010-248011 A | 11/2010 |
| JP | 4625913 B2 | 2/2011 |
| JP | 2011-048979 A | 3/2011 |
| JP | 2011-058579 A | 3/2011 |
| JP | 2011-159697 A | 8/2011 |
| JP | 2011-201976 A | 10/2011 |
| JP | 2011-201977 A | 10/2011 |
| JP | 2011-235532 A | 11/2011 |
| JP | 2011-235556 A | 11/2011 |
| JP | 2011-236349 A | 11/2011 |
| JP | 2011-248011 A | 12/2011 |
| JP | 2012-030424 A | 2/2012 |
| JP | 2012-035532 A | 2/2012 |
| JP | 2012-119611 A | 6/2012 |
| JP | 2012-166999 A | 9/2012 |
| JP | 2012-209545 A | 10/2012 |
| JP | 5057657 B2 | 10/2012 |
| JP | 2012-212939 A | 11/2012 |
| JP | 2012-227310 A | 11/2012 |
| JP | 2012-248011 A | 12/2012 |
| JP | 2013-010340 A | 1/2013 |
| JP | 2013-010342 A | 1/2013 |
| JP | 5111620 B2 | 1/2013 |
| JP | 2013-184346 A | 9/2013 |
| JP | 2013-184872 A | 9/2013 |
| JP | 2013-207084 A | 10/2013 |
| JP | 2013-224475 A | 10/2013 |
| JP | 2014-019597 A | 2/2014 |
| JP | 2015-093405 A | 5/2015 |
| JP | 2015-093795 A | 5/2015 |
| JP | 2015-116694 A | 6/2015 |
| JP | 2015-209471 A | 11/2015 |
| JP | 2016-106047 A | 6/2016 |
| JP | 2017-500259 A | 1/2017 |
| JP | 2017-500753 A | 1/2017 |
| JP | 2017-087417 A | 5/2017 |
| KR | 10-2008-0096372 A | 10/2008 |
| KR | 10-2008-0113576 A | 12/2008 |
| KR | 10-2009-0114195 A | 11/2009 |
| KR | 10-2010-0051499 A | 5/2010 |
| KR | 10-2010-0057521 A | 5/2010 |
| KR | 10-2010-0112628 A | 10/2010 |
| KR | 10-1002936 B1 | 12/2010 |
| KR | 10-2011-0033284 A | 3/2011 |
| KR | 10-2011-0043376 A | 4/2011 |
| KR | 2011-0045136 A | 5/2011 |
| KR | 10-2011-0068352 A | 6/2011 |
| KR | 10-1073032 B1 | 10/2011 |
| KR | 10-2011-0134708 A | 12/2011 |
| KR | 10-2012-0023063 A | 3/2012 |
| KR | 10-2012-0031698 A | 4/2012 |
| KR | 10-2012-0033284 A | 4/2012 |
| KR | 10-2012-0056227 A | 6/2012 |
| KR | 10-2012-0057346 A | 6/2012 |
| KR | 10-2012-0064676 A | 6/2012 |
| KR | 10-2012-0069608 A | 6/2012 |
| KR | 10-1164945 B1 | 7/2012 |
| KR | 10-2012-0098640 A | 9/2012 |
| KR | 10-2012-0100274 A | 9/2012 |
| KR | 2013-0003997 A | 1/2013 |
| KR | 10-2013-0044774 A | 5/2013 |
| KR | 10-2013-0095605 A | 8/2013 |
| KR | 10-2013-0104534 A | 9/2013 |
| KR | 10-2015-0038177 A | 4/2015 |
| KR | 10-1522941 B1 | 6/2015 |
| TW | 201315593 A | 4/2013 |
| TW | 201332768 A | 8/2013 |
| TW | 201442968 A | 11/2014 |
| TW | 201545886 A | 12/2015 |
| TW | 201545887 A | 12/2015 |
| WO | 92/22604 A1 | 12/1992 |
| WO | 95/17537 A1 | 6/1995 |
| WO | 02/84722 A2 | 10/2002 |
| WO | 03/44079 A1 | 5/2003 |
| WO | 2005/048669 A1 | 5/2005 |
| WO | 2006/093639 A1 | 9/2006 |
| WO | 2007/018028 A1 | 2/2007 |
| WO | 2007/121524 A1 | 11/2007 |
| WO | 2008/007622 A1 | 1/2008 |
| WO | 2008/044884 A1 | 4/2008 |
| WO | 2010/051106 A2 | 5/2010 |
| WO | 2010/059710 A1 | 5/2010 |
| WO | 2010/079688 A1 | 7/2010 |
| WO | 2010/098762 A1 | 9/2010 |
| WO | 2010/121524 A1 | 10/2010 |
| WO | 2010/128611 A1 | 11/2010 |
| WO | 2010/129459 A2 | 11/2010 |
| WO | 2011/031507 A1 | 3/2011 |
| WO | 2011/048979 A1 | 4/2011 |
| WO | 2011/104500 A1 | 9/2011 |
| WO | 2011/142280 A1 | 11/2011 |
| WO | 2012/000686 A1 | 1/2012 |
| WO | 2012/057893 A2 | 5/2012 |
| WO | 2012/074952 A1 | 6/2012 |
| WO | 2012/144499 A1 | 10/2012 |
| WO | 2013/006865 A2 | 1/2013 |
| WO | 2013/044941 A1 | 4/2013 |
| WO | 2013/058217 A1 | 4/2013 |
| WO | 2013119737 A2 | 8/2013 |
| WO | 2013/179881 A1 | 12/2013 |

(56) References Cited

FOREIGN PATENT DOCUMENTS

| | | | |
|---|---|---|---|
| WO | 2014/050798 A1 | 4/2014 |
| WO | 2014/093193 A1 | 6/2014 |
| WO | 2014/093740 A1 | 6/2014 |
| WO | 2014/093775 A1 | 6/2014 |
| WO | 2014/093776 A1 | 6/2014 |
| WO | 2014/142280 A1 | 9/2014 |
| WO | 2014/151353 A1 | 9/2014 |
| WO | 2014/163035 A1 | 10/2014 |
| WO | 2015/054098 A1 | 4/2015 |
| WO | 2015/057605 A1 | 4/2015 |
| WO | 2015/112958 A1 | 7/2015 |
| WO | 2015/113020 A1 | 7/2015 |
| WO | 2015/113023 A1 | 7/2015 |
| WO | WO 2015-112958 | 7/2015 |
| WO | 2015/119210 A1 | 8/2015 |
| WO | 2015/156395 A1 | 10/2015 |
| WO | 2015/157202 A1 | 10/2015 |
| WO | 2015/163134 A1 | 10/2015 |
| WO | 2016/017645 A1 | 2/2016 |
| WO | 2016/187186 A1 | 11/2016 |
| WO | 2016/209897 A1 | 12/2016 |
| WO | 2018/038961 A1 | 3/2018 |

OTHER PUBLICATIONS

Nagai et al; "Structure and Morphology of Phenylsilanes Polymer Films Synthesized by the Plasma Polymerization Method"; Journal of Material Science 33, (1998); 1897-1905.
Nehlsen et al; "Gas Permeation Properties of Plasma Polymerized Thin Film Siloxane-Type Membranes for Temperatures up to 350C"; Journal of Membrane Science; 106 (1995) pp. 1-7.
Nouicer et al; "Superhydrophobic Surface Produced on Polyimide and Silicon by Plasma Enhanced Chemical Vapour Deposition From Hexamethyldisiloxane Precursor" International Journal of Nanotechnology, vol. 12, Nos. 8/9, 2015; pp. 597-607.
Oujja et al; "Multiphoton Dissociation of Phenylsilane Upon Excitation at 212.5NM"; Laser Chem., vol. 16, pp. 157-166.
Parker et al; "Surface Forces Between Plasma Polymer Films"; Langmuir 1994, 10, 276-2773.
PCT—International Search Report form 220 for WO 14/093193; dated Mar. 24, 2014.
PCT—International Search Report form 220 for WO 14/093740; dated Mar. 25, 2014.
PCT—International Search Report form 220 for WO 14/093776; dated Mar. 21, 2014.
Perlast G67P—Technical Data Sheet, Issue 4, Revision 1, Jan. 2006; 1 Page.
Rouessac et al; "Precursor Chemistry for ULK CVD", Microelectronic Engineering, V82, p. 333-340, 2005.
Salyk et al; "Plasma Polymerisation of Methylphenylsilane"; Surface & Coatings Technology, 20, (2005) pp. 486-489.
Shieh et al; "Modifications of Low Dielectric Constant Fluorinated Amorphous Carbon Films by Multiple Plasma Treatments"; J. Electro. Soc.; 149 (7) G384-G390 (2002.
Sindorf et al; "Cross-Polarization/Magic-Angle-Spinning Silicon-29 Nuclear Magnetic Resonance Study of Silica Gel Using Trimethylsilane Bonding as a Probe of Surface Geometry and Reactivity"; J. Phys. Chem. 1982, 86, 5208-5219.
Stoffels et al; "Polymerization of Fluorocarbons in Reactive Ion Etching Plasma"; Journal of Vacuum Science and Technology; Part A, AVS / AIP, Melville, NY, vol. 16, No. 1, Jan. 1, 1998, pp. 87-95.
Suratawal et al; "Surface Chemistry and Trimethylsilyl Functionalization of Stober Silica Sols"; Journal of Non-Crystalline Solids 316 (2003), pp. 349-363.
Tauc et al; "Optical Properties and Electronic Structure of Amorphous Germanium"; Phys. Stat. Sol. 15, (1966) pp. 627-637.
Terlingen et al; "Plasma Modification of Polymeric Surfaces for Biomedical Applications"; Advanced Biomaterials in Biomedical Engineering and Drug Delivery Systems, 1996; pp. 38-42.
Tillet et al; "Crosslinking of Fluoroelastomers by "Click" Azide-Nitride Cyloaddtion"; Journal of Polymer Science, Part A: Polymer Chemistry; 2015, 53, pp. 1171-1173.
Tong et al; "Reversible Silicon Wafer Bonding for Surface Protection: Water-Enhanced Debonding"; J. Electrochem. Soc., vol. 139, No. 11, Nov. 1992, pp. L101-L102.
Trelleborg Sealing Solutions, Isolast(Registered) Perfluororelastomer Seals, Edition Nov. 2008; pp. 1-16; www.tss.trelleborg.com.
Van De Ven et al; "Deactivation With Silazanes in Chromatography, Mechanism of the Reaction and Practical Consequences in Capillary GC and RP-HPLC: A29SI GP-MAS NMR Study"; Journal of High Resolution Chromatography & Chromatography Communications; vol. 9, 1986; pp. 741-746.
Wang et al; "Dynamic Contact Angles and Contact Angle Hysteresis of Plasma Polymers"; Langmuir 1994, 10, pp. 3887-3897.
Weidman et al; "New Photodefinable Glass Etch Masks for Entirely Dry Photolithography Plasma Deposited Organosilicon Hydride Polymers"; Appl. Phys. Leti. 62 (4), Jan. 25, 1993 pp. 372-374.
Worldwide First Ultra-thin LTPS-TFT LCD by A Glass on Carrier Technology, Chiao, et al., v3, submitted to SID 2015.
Wu; "Calculation of Interfacial Tension in Polymer Systems"; J. Polymer. Sci.: Part C; No. 34, pp. 19-30 (1971).
Wu; "Polymer Interface and Adhesion"; Modifications of Polymer Surfaces, Chapter 9—Marcel Dekker; pp. 298-321.
Zhuravlev; "The Surface Chemistry of Amorphous Silica. Zhuravlev Model"; Colloids and Surfaces A: Physicochemical and Engineering Aspects; 173 (2000) 1-38.
2006 Gelest Brochure on Thermal Stability of Sllanes, p. 14.
2014 Gelest Brochure—Silane Coupling Agents Connecting Across Boundaries.
3M Dyneon High Temperature Perfluoroelastomer PFE 4131TZ—Technical Data.
ASTM International E595-07, Standard Test Method for Total Mass Loss and Collected Volatile Condensable Materials from Outgassing in a Vacuum Environment (2013).
Biederman; "The Properties of Films Prepared by the RF Sputtering of PTFE and Plasma Polymerization of Some Freons"; Vacuum, vol. 31, No. 7, Jan. 1, 1981, pp. 285-289.
Bosher et al; "Influence of Cyclic Organosilicon Precursors on the Corrosion of Aluminium Coated Sheet by Atmospheric Pressure Dielectric Barrier Discharge"; Surface & Coatings Technology, 205 (2011) pp. 5350-5357.
Cech et al; "Surface-Free Energy of Silicon-Based Plasma Polymer Films"; Silanes and Other Coupling Agents,_ vol. 5, 2009; pp. 333-348.
Chemraz "Perfluoroelastomers—Seals That Withstand the Test of Time", Greene Tweed Medical & Biotechnology, 2000, 4 Pages.
Chiao et al; "Worldwide First Ultra-Thin LTPS-TFT LCD by a Glass on Carrier Technology" V3, Submitted to SID 2015; 5 Pages.
Dupont Kalrez Perfluoroelastomer Parts—Physical Properties and Product Comparisons, Technical Information—Rev. 11, Sep. 2012; 4 Pages.
English Translation of JP2016547990 Office Action dated Mar. 27, 2019; 3 Pages; Japanese Patent Office.
European Patent Application No. 15740126.6 Office Action dated Jul. 9, 2020; 5 Pages; European Patent Office.
Extended European Search Report and Written Opinion; 15740126.6; dated Jul. 4, 2017; 9 pages; European Patent Office.
Girifalco et al; "A Theory for the Estimation of Surface and Interfacial Energies. I. Derivation and Application to Interfacial Tension"; Applied Science Research Lab,Cincinnati Ohio; vol. 61 (1956); pp. 904-909.
Groenewoud et al; "Plasma Polymerization of Thiophene Derivatives"; Langmuir, 2003, vol. 19, No. 4; pp. 1368-1374.
Hair; "Hydroxyl Groups on Silica Surface", Journal of Non-Crystalline Solids; 19 (1975) 299-309, .COPYRGT. North-Holland Publishing.
Haller; "Polymerization of Aromatic Silanes in RF Plasmas"; J. Electrochem Soc.: Solid-State Science and Technology; vol. 129, No. 1; Jan. 1982; pp. 180-183.
Haque et al; "Preparation and Properties of Plasma-Deposited Films With Surface Energies Varying Over a Wide Range"; Journal of Applied Polymer Science, vol. 32, 4369-4381 (1986).

(56) References Cited

OTHER PUBLICATIONS

Hiltz; Techniques for the Characterization of Fluoroelastomers, Defence R&D Canada-Atlantic Technical Memorandum Dec. 2009; 52 Pages.
Iller, John Wiley and Sons; "The Surface Chemistry of Silica"; Chapter 6, 1979, pp. 622-656.
International Preliminary Report on Patentability of the International Searching Authority; PCT/US15/12865; dated Aug. 11, 2016; 7 Pages; Korean Intellectual Property Office.
International Search Report and Writien Opinion of the International Searching Authority; PCT/US2016/038663; dated Sep. 23, 2016; 11 Pages; European Patent Office.
International Search Report and Writien Opinion of the International Searching Authority; PCT/US2017/049019; dated Dec. 11, 2017; 14 Pages; Korean Intellectual Property Office.
International Search Report and Writien Opinion of the International Searching Authority; PCT/US2017/049025; dated Feb. 22, 2018; 17 Pages; European Patent Office.
International Search Report and Writien Opinion of the International Searching Authority; PCT/US2018/047056; dated Dec. 7, 2018; 10 Pages; European Patent Office.
International Search Report and Written Opinion of the International Searching Aurthority; PCT/US2017/046836; dated Feb. 7, 2018; 11 Pages; Korean Intellectual Property Office.
International Search Report and Written Opinion of the International Searching Authority; PCT/US15/12865; dated May 22, 2015; 8 Pages; Korean Intellectual Property Office.
International Search Report and Written Opinion of the International Searching Authority; PCT/US2013/073785; dated Mar. 24, 2014; 11 Pages; Korean Patent Office.
International Search Report and Written Opinion of the International Searching Authority; PCT/US2013/074859; dated Mar. 25, 2014; 10 Pages; Korean Patent Office.
International Search Report and Written Opinion of the International Searching Authority; PCT/US2013/074924; dated Mar. 27, 2014; 14 pages; Korean Patent Office.
International Search Report and Written Opinion of the International Searching Authority; PCT/US2013/074926; dated Mar. 21, 2014; 13 Pages; European Patent Office.
International Search Report and Written Opinion of the International Searching Authority; PCT/US2014/059237; dated Mar. 11, 2015; 15 Pages; European Patent Office.
International Search Report and Written Opinion of the International Searching Authority; PCT/US2014/060340; dated Jan. 29, 2015; 13 Pages; European Patent Office.
International Search Report of the International Searching Authority; PCT/US2016/032843; dated Aug. 10, 2016; 14 Pages; European Patent Office.
Invitation to Pay Additional Fees From the International Searching Aurthority; PCT/US2017/049025; dated Nov. 21, 2017; 14 Pages; European Patent Office.
ISR from PCT/US2015/013012.
ISR from PCT/US2015/013017.
ISR from WO2014/'151353.
ISR from WO2014/093775.
ISR from WO2015/054098.
ISR from WO2015/057605.
Jaszewski et al; "The Deposition of Anti-Adhesive Ultra-Thin Teflon-Like Films and Their Interaction With Polymers During Hot Embossing"; Applied Surface Science, 143 (1999) 301-308.
Kuritka et al; "Mass Spectrometry Characterization of Methylphenylsilane-Hydrogen RF Plasmas"; Plasma Process. Polym. 2007, 4, 53-61.
Kuschnereit et al; "Mechanical and Elastic Properties of Amorphous Hydrogenated Silicon Films Studied by Broadband Surface Acoustic Wave Spectroscopy"; Appl. Phys. A 61, 269-276 (1995).
Lowe et al; "Plasma Polymerized P-Xylene as a Laser Fusion Target"; Surface Science, 1978, vol. 76, No. 1; pp. 242-256.
Lubguban, Jr. et al; "Low-K Organosilicate Films Prepared by Tetravinyltetramethylcyclotetrasiloxane", J. of Applied Physics, V92, N2, p. 1033-1038, 2002.
Maszara et al; "Bonding of Silicon Wafers for Silicon-on-Insulators"; J. Appl. Phys. 64 (10), Nov. 15, 1988; pp. 4943-4950.
McMillian et al; "Hydroxyl Sites in SiO2 Glass: A Note on Irfrared and Raman Spectra", American Mineralogist, vol. 71, pp. 772-778, 1986.
Merche et al; "Atmospheric Plasmas for Thin Film Deposition: A Critical Review"; Thin Solid Films 520, (2012) 4219-4236.
Sohn, et al., "Effects of plasma polymerized para-xylene intermediate layers on characteristics of flexible organic light emitting diodes fabricated on polyethylene terephthalate substrates" Journal of Alloys and Compounds, 449, 191-195, 2008. (Year: 2008).

\* cited by examiner

METHODS FOR TREATING A SUBSTRATE AND METHOD FOR MAKING ARTICLES COMPRISING BONDED SHEETS

This application claims the benefit of priority under 35 U.S.C. § 371 of International Application No. PCT/US2018/065330, filed on Dec. 13, 2018, which claims the benefit of priority under 35 U.S.C. § 119 of U.S. Provisional Application Ser. No. 62/599,348 filed on Dec. 15, 2017, the content of each of which is relied upon and incorporated herein by reference in its entirety.

FIELD

The present disclosure relates generally to methods for making sheets on carriers and, more particularly, to methods for making glass sheets controllably bonded on treated glass carriers.

BACKGROUND

Flexible substrates offer the ability to manufacture cheaper devices using roll-to-roll processing, and the potential to make thinner, lighter, more flexible and durable displays. However, the technology, equipment, and processes required for roll-to-roll processing of high quality displays are not yet fully developed. Because panel makers have already heavily invested in toolsets to process large sheets of glass, laminating a flexible substrate to a carrier and making display devices on the flexible substrate by sheet-to-sheet processing offers a shorter term solution to develop thinner, lighter, and more flexible displays. Displays have been demonstrated on polymer sheets, for example polyethylene naphthalate (PEN), where the device fabrication was sheet-to-sheet with the PEN laminated to a glass carrier. However, the upper temperature limit of the PEN limits the device quality and process that can be used. In addition, the high permeability of the polymer substrate leads to environmental degradation of organic light emitting diode (OLED) devices where a near hermetic package is required. Film encapsulation offers the promise to overcome this limitation, but it has not yet been demonstrated to offer acceptable yields at large volumes.

In a similar manner, display devices can be manufactured using a glass carrier laminated to one or more glass substrates. It is anticipated that the low permeability and improved temperature and chemical resistance of the glass will enable higher performance longer lifetime flexible displays.

Some devices utilize color filter (CF) or amorphous silicon film transistors (a-Si TFTs), which are typically fabricated at temperatures around 250 and 350° C., respectively. However, higher temperature applications, including, for example, indium gallium zinc oxide (IGZO or Oxide TFT) and low temperature polysilicon (LTPS) devices are also important. Oxide TFT processing is typically performed at temperatures of 400 to 450° C. In LTPS device fabrication processes, temperatures typically approach 600° C. or greater. In each of these processing techniques, vacuum and wet etch environments may also be used. These conditions limit the materials that may be used, and place high demands on the carrier/sheet. Accordingly, what is desired is a carrier approach that utilizes the existing capital infrastructure of the manufacturers, enables processing of glass, i.e., glass having a thickness≤0.3 millimeters (mm) thick, without contamination or loss of bond strength between the glass and carrier at higher processing temperatures, and wherein the glass de-bonds easily from the carrier at the end of the process. The approach should allow for: a) spontaneous bonding between a carrier and a sheet at room temperature, preferably without the need for lamination, to provide sufficient bond or adhesion energy on the order of 100-500 mJ/m$^2$; b) subsequent wet and dry processing steps without detachment of the sheet from the carrier; c) ability for the bonded pair to withstand the thermal, chemical, vacuum, and wet processing steps of fabrication; d) minimal outgassing during thermal processing; and e) ease of separation of the sheet from the carrier at the end of processing.

One commercial advantage is that manufacturers will be able to utilize their existing capital investment in processing equipment while gaining the advantages of thin sheets, e.g., glass sheets, for photo-voltaic (PV) structures, OLED, liquid crystal displays (LCDs) and patterned film transistor (TFT) electronics, for example. Additionally, such an approach enables process flexibility, including: processes for cleaning and surface preparation of the glass sheet and carrier to facilitate bonding.

A challenge of known bonding methods is the high temperature used to process polysilicon TFTs. The demand for higher pixel density, high resolution, and fast refresh rates on hand held displays, notebook and desktop displays, as well as the wider use of OLED displays, is pushing panel makers from amorphous silicon TFT backplanes to oxide TFT or polysilicon TFT backplanes. Because OLEDs are a current driven device, high mobility is desired. Polysilicon TFTs also offer the advantage of integration of drivers and other component activation. In polysilicon TFT processes, higher temperature is preferred for dopant activation, ideally at temperature over 600° C.

SUMMARY

In light of the above, there is a need for a substrate to substrate (e.g., sheet-carrier) article that can withstand the rigors of TFT and flat panel display (FPD) processing, including high temperature processing (without outgassing that would be incompatible with the semiconductor or display making processes in which it will be used), yet allow the entire area of the sheet to be removed (either all at once, or in sections) from the carrier so as to allow the reuse of the carrier for processing another sheet. The present specification describes methods to control the adhesion between the carrier and sheet to create a temporary bond sufficiently strong to survive TFT and FPD processing (including processing at temperatures of about 300° C., about 400° C., about 500° C., and up to at least 600° C., including any ranges and subranges therebetween), but weak enough to permit debonding of the sheet from the carrier, even after high-temperature processing. Such controlled bonding can be utilized to create an article having a re-usable carrier, or alternately an article having patterned areas of controlled bonding between a carrier and a sheet. More specifically, the present disclosure provides modification or coating (hereinafter "coating") layers (including various materials and associated surface heat treatments), that may be provided on the sheet, the carrier, or both, to control both room-temperature van der Waals, and/or hydrogen, bonding and high temperature covalent bonding between the sheet and carrier. In addition, the present disclosure describes methods of depositing a coating layer that serves to bond a sheet to a carrier, methods for preparing the coating layer for bonding, and bonding the coating layer to both the sheet and the carrier. These methods produce bonding between the components such that the bonding energy is not too high, which might render the components inseparable after electronic device processing, and such that the bonding energy is not too low, which might lead to compromised bonding quality thus leading to possible de-bonding or fluid ingress between the sheet and carrier during electronic device processing. These methods also produce a glass article that exhibits low outgassing and survives high temperature processing for example, a-Si TFT processing as well additional processing steps, for example wet cleaning and dry etching. In alternative embodiments, the coating layers may be used to create various controlled bonding areas (wherein the carrier and sheet remain sufficiently bonded through various processes, including vacuum processing, wet processing, and/or ultrasonic cleaning processing), together with covalent bonding regions to provide for further processing options, for example, maintaining hermeticity between the carrier and sheet even after dicing the article into smaller pieces for additional device processing.

In a first aspect, there is a method for treating a substrate surface that includes the steps of: a. arranging a base substrate (e.g., a carrier) on a chuck in a reaction chamber, the reaction chamber having an inductively coupled plasma coil and a gas supply inlet, the chuck and inductively coupled plasma coil being independently connected to an electric power supply; b. supplying a polymer forming fluorine gas source to the gas supply inlet and flowing the polymer forming fluorine gas source into the reaction chamber to contact the substrate arranged on the chuck, the polymer forming fluorine gas source includes a fluorine component of the formula $C_xH_zF_y$, wherein x is selected from 1-4, y is selected from 3-8, and z is selected from 0-3, wherein when x is 1 then y is 3 and z is 1; c. supplying electric power to the inductively coupled plasma coil and the chuck; d. depositing a carbon-based material derived from the polymer forming fluorine gas source to form a coating layer on the substrate; e. exposing the deposited coating layer to a treatment gas to form a treated coated substrate; f. removing the treated coated substrate from the reaction chamber.

In example of the first aspect, the carbon-based material includes a plasma-polymerized fluoropolymer.

In another example of the first aspect, the plasma-polymerized fluoropolymer has an atomic surface concentration of fluorine of less than 15%

In another example of the first aspect, the polymer forming fluorine gas source is selected from $CHF_3$, $C_2F_4$, $C_3F_8$, $C_4F_8$, and any combination thereof.

In another example of the first aspect, the polymer forming fluorine gas source is free of an etching gas.

In another example of the first aspect, the etching gas includes at least one of $CF_4$, $SF_6$, $NF_3$, and any combination thereof.

In another example of the first aspect, the coating layer has an average thickness in the range of 1 to 10 nanometers (nm).

In another example of the first aspect, the coating layer is a monolayer.

In another example of the first aspect, the base substrate is glass and has a thickness of 300 microns or less.

In another example of the first aspect, the reaction chamber has an internal pressure less than 30 Torr during the step of depositing the carbon-based material to form the coating layer.

In another example of the first aspect, step c includes supplying the chuck with electric power at 3 to 5 $W/m^2$.

In another example of the first aspect, the chuck operates at a self-bias of less than 60 V.

In another example of the first aspect, the treatment gas is at least one of nitrogen, oxygen, hydrogen, carbon dioxide gas, and a combination thereof.

In another example of the first aspect, the chuck operates at a self-bias in the range of 150 V to 250 V during exposure of the deposited coating layer to treatment gas.

In another example of the first aspect, the deposited coating layer is exposed to the treatment gas for 0.5 to 10 seconds.

In another example of the first aspect, the coating layer of the treated coated substrate has a bonding surface.

In another example of the first aspect, the bonding surface has an atomic surface concentration of fluorine of less than 40%, wherein the atomic surface concentration is measured from the bonding surface prior to contacting the bonding surface with a second substrate.

In another example of the first aspect, the coating layer has a surface roughness less than 0.5 nm.

In another example of the first aspect, the bonding surface has an atomic surface concentration of fluorine of less than 30%.

In another example of the first aspect, the bonding surface has an atomic surface concentration of silicon of greater than 5%, wherein the atomic surface concentration are measured from the bonding surface prior to contacting the bonding surface with a second substrate.

In another example of the first aspect, the bonding surface has an atomic surface concentration of silicon in the range of 8 to 12%.

In a second aspect, there is provided the method of aspect 1, further including directly bonding the coating layer with a second substrate to form an article, wherein the coating layer is positioned between the base substrate and the second substrate and can be in direct contact with both the base substrate and the second substrate.

In an example of the second aspect, the bonding energy between the coating layer and the second substrate is less than 800 $mJ/m^2$, or in a range of about 300 to about 800 $mJ/m^2$, after holding the article at 750° C. for 10 minutes in a nitrogen atmosphere.

In another example of the second aspect, the base substrate and the second substrate are glass.

In a third aspect, there is a method of making an article including: a. arranging a base glass substrate on a chuck in a reaction chamber, the reaction chamber having an inductively coupled plasma coil and a gas supply inlet, the chuck being connected to a first electric power supply and the inductively coupled plasma coil being connected to a second electric power supply, the first and second power supplies being different and independent of one another; b. supplying a polymer forming fluorine gas source to the gas supply inlet and flowing the polymer forming fluorine gas source into the reaction chamber to contact the substrate arranged on the chuck, the polymer forming fluorine gas source including a fluorine component of the formula $C_xH_zF_y$, wherein x is selected from 1-4, y is selected from 3-8, and z is selected from 0-3, wherein when x is 1 then y is 3 and z is 1; c. supplying electric power to the inductively coupled plasma coil and the chuck, wherein the chuck is operated at a self-bias of less than 60 V; d. depositing a carbon-based material derived from the polymer forming fluorine gas source to form a coating layer on the glass substrate; e. exposing the deposited coating layer to treatment gas to form a treated coated substrate, wherein the coating layer of the treated coated substrate has a free and exposed bonding surface, the bonding surface having an atomic surface concentration of fluorine of less than 40%, wherein the atomic surface concentration is measured from the bonding surface prior to contacting the bonding surface with a second substrate; f. removing the treated coated substrate from the reaction chamber; g. directly bonding the coating layer with the second glass substrate to form an article, wherein the coating layer is positioned between the base glass substrate and the second glass substrate.

In an example of the third aspect, the bonding surface has an atomic surface concentration of silicon of greater than 5%, wherein the atomic surface concentration are measured from the bonding surface prior to contacting the bonding surface with a second substrate.

In another example of the third aspect, the bonding surface has an atomic surface concentration of silicon in the range of 8 to 12%.

In another example of the third aspect, the bonding surface has an atomic surface concentration of fluorine of less than 20% or in the range of about 10 to about 20%.

In another example of the third aspect, the bonding energy between the coating layer and the second substrate is less than 800 mJ/m$^2$, or in a range of about 300 to about 800 mJ/m$^2$, after holding the article at 750° C. for 10 minutes in a nitrogen atmosphere.

In another example of the third aspect, the chuck operates at a self-bias in the range of 150 V to 250 V during exposure of the deposited coating layer to treatment gas and the deposited coating layer being exposed to the treatment gas for 0.5 to 10 seconds.

In another example of the third aspect, step c. includes supplying the chuck with electric power at 3 to 5 W/m$^2$.

In another example of the third aspect, the carbon-based material includes a plasma-polymerized fluoropolymer.

In another example of the third aspect, the plasma-polymerized fluoropolymer includes a $CHF_3$—$C_4F_8$ plasma polymerized fluoropolymer.

In another example of the third aspect, the polymer forming fluorine gas source is selected from $CHF_3$, $C_2F_4$, $C_3F_8$, $C_4F_8$, and any combination thereof.

In another example of the third aspect, the coating layer has an average thickness in the range of 1 to 10 nm.

In another example of the third aspect, the carbon-based material is deposited in the absence of an etching gas in the reaction chamber. For example, the reaction chamber only includes the polymer forming fluorine gas source and no other gases are present or substantially present.

In another example of the third aspect, the etching gas includes at least one of $CF_4$, $SF_6$, $NF_3$, and any combination thereof.

Any one of the above aspects (or examples of those aspects) may be provided alone or in combination with any one or more of the examples of that aspect discussed above; e.g., the first aspect may be provided alone or in combination with any one or more of the examples of the first aspect discussed above; and the second aspect may be provided alone or in combination with any one or more of the examples of the second aspect discussed above; and so-forth.

The accompanying drawings are included to provide a further understanding of principles of the disclosure, and are incorporated in and constitute a part of this specification. The drawings illustrate some examples(s), and together with the description serve to explain, by way of example, principles and operation thereof. It is to be understood that various features disclosed in this specification and in the drawings can be used in any and all combinations. By way of non-limiting example the various features may be combined with one another as set forth in the specification, above, as aspects.

BRIEF DESCRIPTION OF THE DRAWINGS

The above and other features, aspects and advantages of the embodiments disclosed in the present specification are better understood when the following detailed description thereof is read with reference to the accompanying drawings, in which.

DETAILED DESCRIPTION

Figure 1:
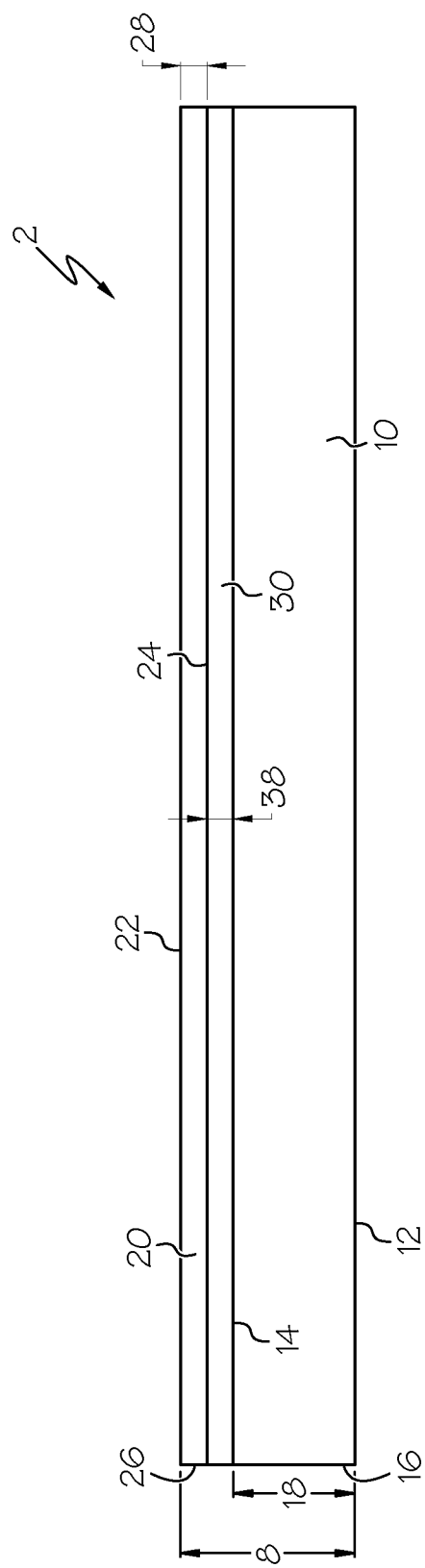
FIG. 1 is a schematic side view of an article having a carrier (first substrate) bonded to a sheet (second substrate) with a coating layer therebetween and in direct contact with the carrier and sheet.

Example embodiments will now be described more fully hereinafter with reference to the accompanying drawings in which example embodiments are shown. Whenever possible, the same reference numerals are used throughout the drawings to refer to the same or like parts. However, the embodiments may take on many different forms and should not be construed as limited to the examples set forth herein. These example embodiments are provided so that this disclosure will be both thorough and complete, and will fully convey the scope of the claims to those skilled in the art.

Directional terms as used herein (e.g., up, down, right left, front, back, top, bottom) are made only with reference to the figures as drawn and are not intended to imply absolute orientation.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values about 10% of each other, such as about 5% of each other, or about 2% of each other.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, as an example, a glass that is "free of" or "substantially free of $B_2O_3$," for example, is one in which $B_2O_3$ is not actively added or batched into the glass, but may be present in very small amounts (e.g., <0.001 mol %) as a contaminant. Similar to $B_2O_3$, other components, such as a compound being "free of" or "substantially free of" oxygen, may be characterized in the same manner.

Provided are solutions for allowing the processing of a second substrate (sometimes referred to as a "sheet") on a base substrate, whereby at least portions (including up to all) of the second substrate, for example, a glass sheet, remain "non-bonded" so that devices processed on the sheet may be removed from the base substrate, for example, a carrier. In order to maintain advantageous surface shape characteristics, the carrier is typically a display grade glass substrate. Accordingly, in some situations, it is wasteful and expensive to merely dispose of the carrier after one use. Thus, in order to reduce costs of display manufacture, it is desirable to be able to reuse the carrier to process more than one sheet. The present disclosure sets forth articles and methods for enabling a sheet to be processed through the harsh environment of the processing lines, for example TFT, including high temperature processing, wherein high temperature processing is processing at a temperature≥400° C., and may vary depending upon the type of device being made, for example, temperatures up to about 450° C. as in amorphous silicon or amorphous indium gallium zinc oxide (IGZO) backplane processing, up to about 500-550° C. as in crystalline IGZO processing, or up to about 600-650° C. as is typical in LTPS and TFT processes—and yet still allows the sheet to be easily removed from the carrier without damage (for example, wherein one of the carrier and the sheet breaks or cracks into two or more pieces) to the sheet or carrier, whereby the carrier may be reused.

Article

Figure 2:
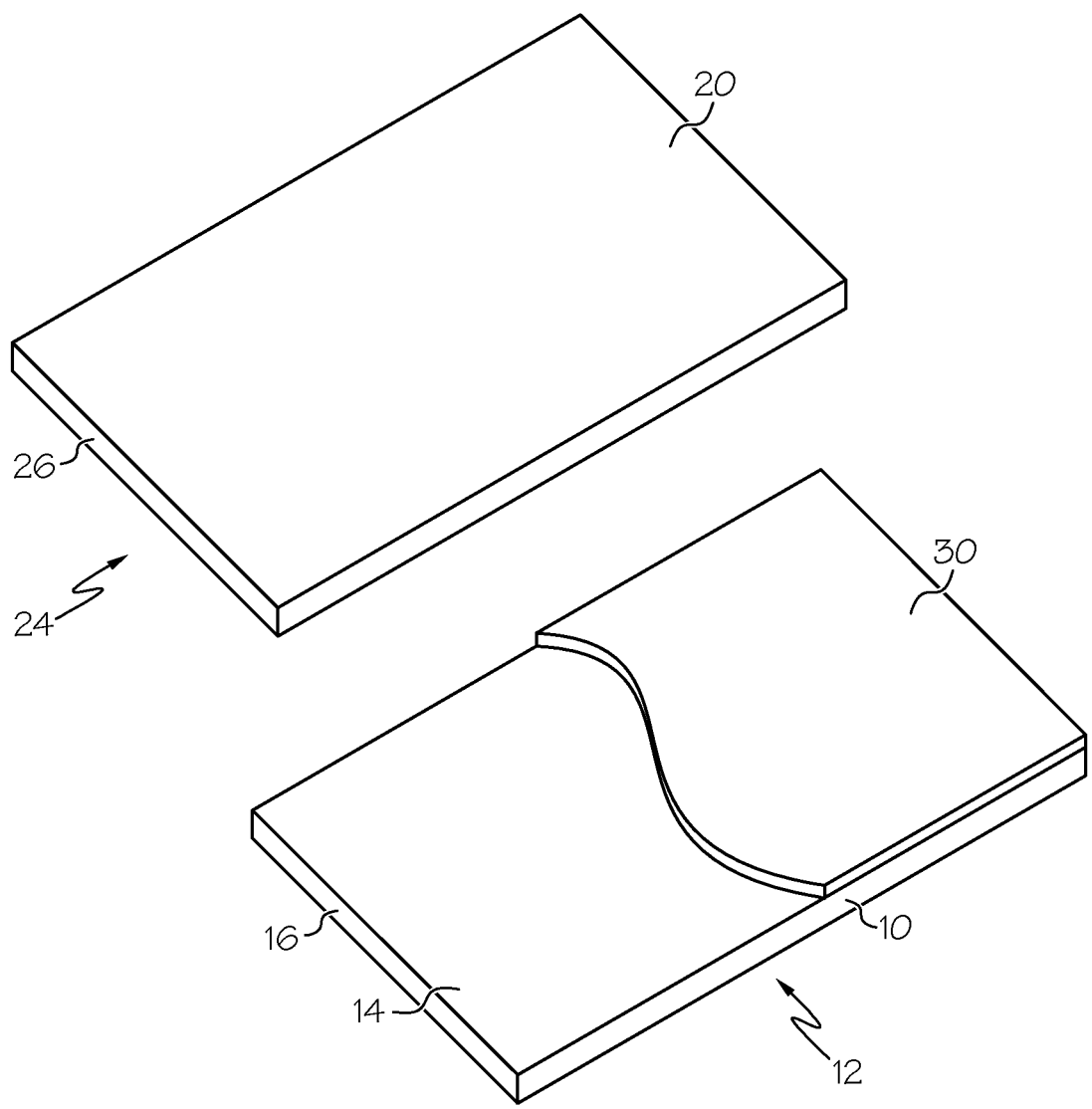
FIG. 2 is a partially cut-away view of the article in FIG. 1.

As shown in FIGS. 1 and 2, an article 2, for example a glass article, has a thickness 8, and includes a base substrate (e.g., a carrier) 10 having a thickness 18, a second substrate (e.g., a sheet) 20 having a thickness 28, and a coating layer 30 having a thickness 38. The average thickness 28 of the second substrate 20 may be, for example, equal to or less than about 300 micrometers (μm or microns), including but not limited to thicknesses of, for example, about 10 to about 50 μm, about 50 to about 100 μm, about 100 to about 150 μm, about 150 to about 300 μm, about 300 μm, about 250 μm, about 200 μm, about 190 μm, about 180 μm, about 170 μm, about 160 μm, about 150 μm, about 140 μm, about 130 μm, about 120 μm, about 110 μm, about 100 μm, about 90 μm, about 80 μm, about 70 μm, about 60 μm, about 50 μm, about 40 μm, about 30 μm, about 20 μm, or about 10 μm, including any ranges and subranges therebetween.

The article 2 is arranged to allow the processing of second substrate 20 in equipment designed for thicker sheets, for example, those having an average thickness on the order of greater than or equal to about 0.4 mm, for example about 0.4 mm, about 0.5 mm, about 0.6 mm, about 0.7 mm, about 0.8 mm, about 0.9 mm, or about 1.0 mm, although second substrate 20 itself is equal to or less than about 300 μm. The thickness 8 of the article 2, which is the sum of thicknesses 18, 28, and 38, can be equivalent to that of the thicker sheet for which a piece of equipment, for example equipment designed to dispose electronic device components onto substrate sheets, was designed to process. In an example, if the processing equipment was designed for a 700 μm sheet, and the sheet had a thickness 28 of about 300 μm, then thickness 18 would be selected as about 400 μm, assuming that thickness 38 of the coating layer is negligible. That is, the coating layer 30 is not shown to scale, but rather it is greatly exaggerated for sake of illustration only. Additionally, in FIG. 2, the coating layer 30 is partially shown in a cut-away view. The coating layer 30 can be disposed uniformly, or substantially uniformly, over the bonding surface 14 when providing a reusable carrier. Typically, the average thickness 38 will be on the order of nanometers (nm), for example from about 2 nm to about 1 μm, from about 5 nm to about 250 nm, or from about 20 nm to about 100 nm, or about 30 nm, about 40 nm, about 50 nm, about 60 nm, about 70 nm, about 80 nm or about 90 nm. In another example, thickness 38 can be less than about 200 nm, about 150 nm, about 100 nm, about 75 nm, about 50 nm, about 40 nm, about 30 nm, about 20 nm or about 10 nm. The presence of a coating layer 30 may be detected by surface chemistry analysis, for example by time-of-flight secondary ion mass spectrometry (ToF SIMS) or X-ray photoelectron spectroscopy (XPS). Thus, the atomic concentration of components on a bonding surface of the coating layer, for example, after it is deposited on a carrier, can be measured prior to bonding with another substrate.

Base substrate 10 has a first surface 12, a bonding surface 14, and a perimeter 16. The base substrate 10 may be of any suitable material including glass. The base substrate can be a non-glass material, for example, ceramic, fused silica, glass-ceramic, silicon, metal, or combinations thereof (as the surface energy and/or bonding may be controlled in a manner similar to that described below in connection with a glass carrier). If made of glass, substrate 10 may be of any suitable composition including alumino-silicate, boro-silicate, alumino-boro-silicate, soda-lime-silicate, and may be either alkali containing or alkali-free depending upon its ultimate application. Further, in some examples, when made of glass, glass-ceramic, or other material, the base substrate bonding surface can be made of a coating or layer of metal material disposed on the underlying bulk material of the substrate. Thickness 18 may be from about 0.2 to about 3 mm, or greater, for example about 0.2 mm, about 0.3 mm, about 0.4 mm, about 0.5 mm, about 0.6 mm, about 0.65 mm, about 0.7 mm, about 1.0 mm, about 2.0 mm, or about 3.0 mm, or greater, including any ranges and subranges therebetween, and will depend upon the thickness 28, and thickness 38 when thickness 38 is non-negligible, as noted above. The average thickness 18 of substrate 10 in some embodiments may be greater than the thickness 28 of second substrate 20. In some embodiments, thickness 18 may be less than thickness 28. In some embodiments, substrate 10 may be made of a monolayer, as shown, or multiple layers (including multiple sheets) that are bonded together. As used herein, monolayer refers to a layer that results from a single coating layer deposition step as described herein. Thus, multiple coating layer deposition steps result in multiple coating layers. Further, the base substrate may be of a Gen 1 size or larger, for example, Gen 2, Gen 3, Gen 4, Gen 5, Gen 8 or larger (e.g., sheet sizes from about 100 mm×100 mm to about 3 meters×3 meters or greater).

Second substrate 20 has a first surface 22, a bonding surface 24, and a perimeter 26. Perimeters 16 (substrate 10) and 26 (second substrate 20) may be of any suitable shape, may be the same as one another, or may be different from one another. Further, second substrate 20 may be of any suitable material including glass, ceramic, glass-ceramic, silicon, metal, or combinations thereof. As described above for substrate 10, when made of glass, second substrate 20 may be of any suitable composition, including alumino-silicate, boro-silicate, alumino-boro-silicate, soda-lime-silicate, and may be either alkali containing or alkali-free depending upon its ultimate application. The coefficient of thermal expansion of the second substrate can be matched substantially the same with that of the base substrate to reduce any warping of the article during processing at elevated temperatures. The average thickness 28 of second substrate 20 is about 300 µm or less, as noted above, such as about 200 µm or about 100 µm, or thicknesses as noted above. Further, second substrate 20 may be of a Gen 1 size or larger, for example, Gen 2, Gen 3, Gen 4, Gen 5, Gen 8 or larger (e.g., sheet sizes from about 100 mm×100 mm to about 3 meters×3 meters or greater).

The article 2 can have a thickness that accommodates processing with existing equipment, and likewise it can survive the harsh environment in which the processing takes place. For example, TFT processing may be carried out at high temperature (e.g., ≥about 200° C., ≥300° C., ≥400° C., and up to less than 500° C.). For some processes, as noted above, the temperature may be ≥about 200° C., ≥about 250° C., ≥about 300° C., ≥about 350° C., ≥about 400° C., ≥about 500° C., ≥about 600° C., ≥about 700° C. and up to or less than 750° C., including any ranges and subranges therebetween.

To survive the harsh environment in which article 2 will be processed, the bonding surface 14 should be bonded to bonding surface 24 with sufficient strength so that second substrate 20 does not spontaneously separate from base substrate 10. This strength should be maintained throughout the processing so that second substrate 20 does not separate from substrate 10 during processing. Further, to allow second substrate 20 to be removed from substrate 10 (so that substrate 10, for example a carrier, may be reused, for example), the bonding surface 14 should not be bonded to bonding surface 24 too strongly either by the initially designed bonding force, and/or by a bonding force that results from a modification of the initially designed bonding force as may occur, for example, when the article undergoes processing at high temperatures, e.g., temperatures of ≥about 200° C., ≥about 300° C., ≥about 400° C., ≥about 500° C., ≥about 600° C., ≥about 700° C. and up to or less than 750° C., including any ranges and subranges therebetween.

The coating layer 30 may be used to control the strength of bonding between bonding surface 14 and bonding surface 24 so as to achieve both of these objectives. The controlled bonding force is achieved by controlling the contributions of van der Waals (and/or hydrogen bonding) and covalent attractive energies to the total adhesion energy which is controlled by modulating the polar and non-polar surface energy components of second substrate 20 and substrate 10. Alternatively, the coating layer 30 may completely cover one bonding surface (for example bonding surface 14) of one substrate and present a coating layer bonding surface (having characteristics independent of those on the one bonding surface) for coupling to another bonding surface (for example bonding surface 24) of another substrate. This controlled bonding is strong enough to survive TFT processing, for instance, including temperatures≥about 200° C., and in some instances, processing temperatures of ≥about 200° C., ≥about 250° C., ≥about 300° C., ≥about 350° C., ≥about 400° C., ≥about 450° C., ≥about 500° C., ≥about 550° C., ≥about 600° C., ≥about 700° C. and up to or less than 750° C., including any ranges and subranges therebetween, and remain debondable by application of a force sufficient to separate the substrates but not cause significant damage to second substrate 20 and/or substrate 10. For example, the applied force should not break either second substrate 20 or substrate 10. Such debonding permits removal of second substrate 20 and the devices fabricated thereon, and also allows for re-use of substrate 10 as a carrier.

Although the coating layer 30 is shown as a solid layer between second substrate 20 and substrate 10, such need not be the case. For example, the coating layer 30 may be on the order of about 0.1 nm to about 1 µm thick (e.g., about 1 nm to about 10 nm, about 10 nm to about 50 nm, about 50 nm to about 100 nm, about 250 nm, about 500 nm to about 1 µm), and may not completely cover the entire portion of the bonding surface 14. For example, the coverage on bonding surface 14 may be ≤about 100%, from about 1% to about 100%, from about 10% to about 100%, from about 20% to about 90%, or from about 50% to about 90% of the bonding surface 14, including any ranges and subranges therebetween. In some embodiments, the coating layer 30 is a monolayer, and in other embodiments, the coating layer 30 is substantially a monolayer. In other embodiments, the layer 30 may be up to about 50 nm thick, or in other embodiments even up to about 100 nm to about 250 nm thick. The coating layer 30 may be considered to be disposed between and directly in contact with substrate 10 and second substrate 20. In other embodiments, the coating layer 30 modifies the ability of the bonding surface 14 to bond with bonding surface 24, thereby controlling the strength of the bond between substrate 10 and second substrate 20. The material and thickness of the coating layer 30, as well as the treatment of the bonding surfaces 14, 24 prior to bonding and the control of the fluorine, carbon and/or silicon content of the bonding surfaces, can be used to control the strength of the bond (energy of adhesion) between substrate 10 and second substrate 20.

Coating Layer Composition

Examples of materials that can be used for coating layers include fluorocarbons, particularly fluorocarbon polymers. Such fluorocarbon polymers may be formed by depositing a gas from a polymer forming fluorine gas source including at least one fluorocarbon-containing monomer compound on either the base substrate or second substrate.

One group of fluorocarbon-containing monomers as a gas source are compounds of formula $C_xH_zF_y$, where x is selected from 1 to 4, z is selected from 0 to 3, and y is selected from 3 to 8, wherein if x is 1 then y is 3 and z is 1. Examples of fluorocarbon compounds include $CHF_3$, $C_2F_4$, $C_3F_8$, $C_4F_8$, and any combination thereof.

In some embodiments, the polymer forming fluorine gas source can include additional gases along with the one or more fluorocarbon-containing monomer compounds. In other embodiments, it is preferred that that the gas source be free of an etching gas, such as $CF_4$, $SF_6$, and $NF_3$.

Deposition of Coating Layer

Figure 3:
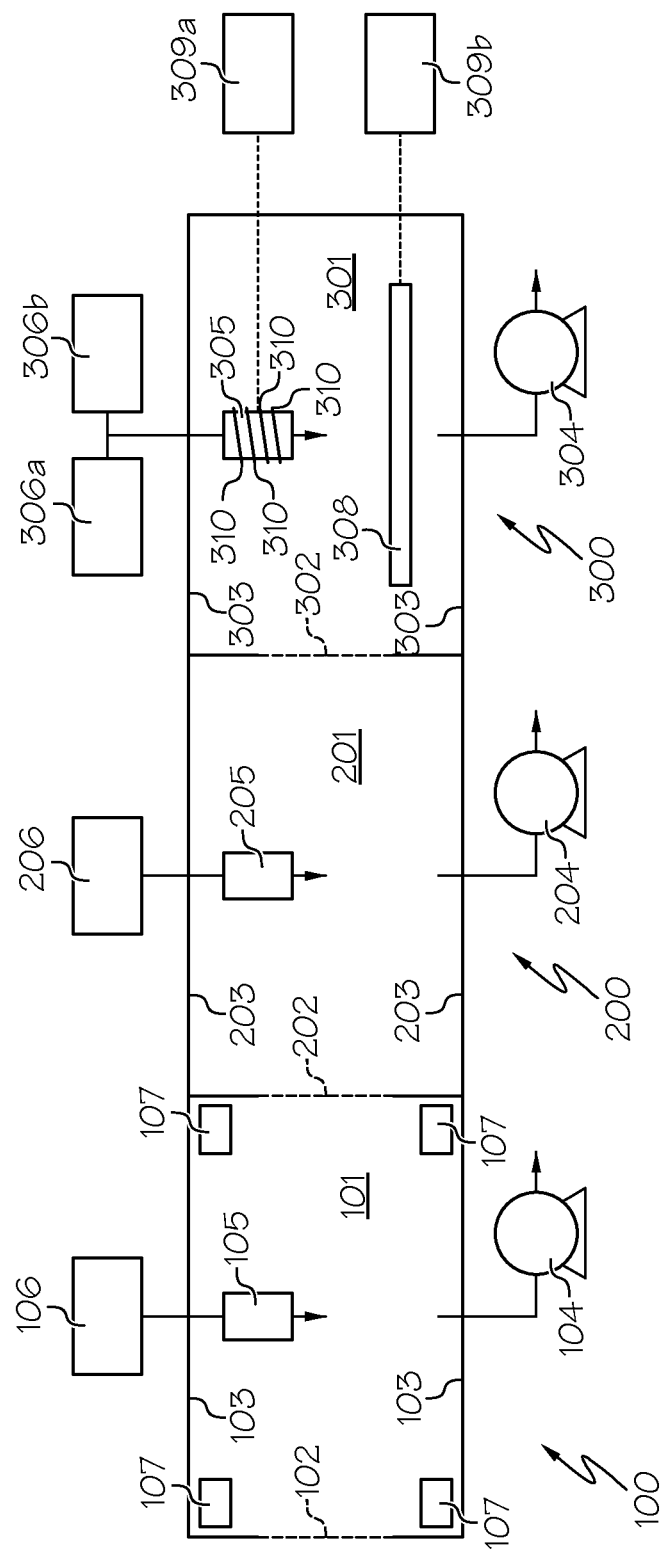
FIG. 3 is schematic diagram showing a system for depositing a coating layer on a base substrate.

In preparing an article as described herein, a coating layer can be first deposited on a base substrate. In an example process for preparing a base substrate (e.g., a carrier) for the deposition of a coating layer as shown in FIG. 3, a base substrate is first delivered to a load lock module 100 where the pressure around the base substrate can be brought to vacuum and temperature of the base substrate can be increased. Subsequently, the base substrate is delivered to a transfer module 200 while remaining under vacuum, which transfers the base substrate to a process module 300, where the coating layer is deposited.

The load lock module 100 has a first door 102 through which materials, such as a glass base substrate, can be delivered to a load lock chamber 101. The load lock module 100 includes chamber walls 103 for sealing the load lock chamber 101 from the external environment, a first vacuum pump 104 for removing gas from the load lock chamber, a first gas supply inlet 105 for introducing gas from a gas source 106 to the load lock chamber 101, heating lamps 107 for heating materials in the load lock chamber, and a second door 202 through which materials can be delivered to the transfer module 200. The first door 102 and second door 202 can be opened to allow materials to pass through them and also closed to seal the load lock chamber 101 from the external environment.

The transfer module 200 is connected to the load lock module 100 by way of the second door 202. The transfer module 200 has a second door 202 through which materials can be received by a transfer chamber 201 from the load lock chamber 101. The transfer module 200 includes chamber walls 203 for sealing the transfer chamber 201 from the external environment, a second vacuum pump 204 for removing gas in the transfer chamber 201, a second gas supply inlet 205 for introducing gas from a gas source 206 to the transfer chamber 201, and a third door 302 through which materials can be delivered to the process module 300. The second door 202 and third door 302 can be opened to allow materials to pass through them and also closed to seal the transfer chamber 201 from the external environment.

The process module 300 is connected to the transfer module 200 by way of the third door 302. The process module 300 has a third door 302 through which materials can be received by a process chamber 301 from the transfer chamber 201. The process module 300 includes chamber walls 303 for sealing the process chamber 301 from the external environment, a third vacuum pump 304 for removing gas from the process chamber 301, a third gas supply inlet 305 through which gas from one or more third gas sources 306a/306b can be delivered to the process chamber, an inductively coupled plasma ("ICP") coil 310 for converting gas from the third gas supply inlet 305 to plasma, and an electrostatic chuck ("chuck") 308 on which a material such as a base substrate can sit. The third door 302 can be opened to allow materials to pass through it and also closed to seal the process chamber 301 from the external environment. The third gas supply inlet 305 can be connected to multiple gas sources 306a/306b so that one or more gases can be fed to the process chamber 301 through the third gas supply inlet 305 simultaneously or separately. Examples of gases from the gas sources include fluorocarbon gases to be used in creating coating layers, a purging gas such as nitrogen for purging the process chamber, a cleaning gas such as oxygen for cleaning the process chamber, and inert gases such as argon. The ICP coil 310 and chuck 308 are connected to an electric power supply 309, preferably independently (see 309a/309b), in order to be electrically powered. The process module 300 also has at least one mechanism or device, for example a heater, for controlling the temperature of the chamber walls 303 and the chuck 308.

In some embodiments, the operation of depositing a coating layer using the above-described system can include the following steps. The first door 102 opens and a base substrate is delivered to the load lock chamber 101. The first door 102 closes, sealing the load lock chamber 101 from the external environment, and gas in the load lock chamber 101 is removed with the first vacuum pump 104 to produce a desired level of vacuum therein. Example levels of vacuum inside the load lock chamber 101 are less $1\times10^{-4}$ Torr, less than $5\times10^{-5}$ Torr, or less than $1\times10^{-5}$ Torr. The heating lamps 107 are operated to heat the base substrate to a desired temperature. Examples of desired temperature for the base substrate is about 65° C. to about 95° C., about 70° C. to about 90° C., or about 75° C. to about 85° C. With the transfer chamber 201 at the desired level of vacuum (e.g., the same as that of the load lock chamber 101) by way of operation of the second vacuum pump 204, the second door 202 is opened and the base substrate is transferred from the load lock chamber 101 to the transfer chamber 201 and the second door 202 is closed again sealing chamber 201. The load lock chamber 101 can then optionally be purged with gas from the first gas source 106 delivered through the first gas supply inlet 105 in preparation for the introduction of another base substrate. With the process chamber 301 at the desired level of vacuum (e.g., the same as that of the transfer chamber 201) by way of operation of the third vacuum pump 304, the third door 302 opens and the base substrate is transferred from the transfer chamber 201 to the process chamber 301 and the third door 302 is closed again sealing chamber 301. The transfer chamber 201 can then optionally be purged with gas from the second gas source 206 delivered through the second gas supply inlet 205 and then brought back to the desired level of vacuum with the second vacuum pump 204 in preparation for the introduction of another base substrate. In the process chamber 301, with the chamber walls 303 and chuck 308 maintained at the desired temperature, the base substrate is placed on the chuck 308 and a polymer forming fluorocarbon gas from the third gas source 306a is delivered through the gas supply inlet 305. In some embodiments, the chamber walls 303 are kept above about 45° C., above about 50° C., above about 55° C. The chuck can be kept above about 25° C., above about 30° C., or above about 35° C. Electric power is supplied to the ICP coil 310, generating fluorocarbon plasma, as well as to the chuck 308, generating a charge in the chuck that attracts the fluorocarbon plasma toward the base substrate positioned on chuck 308, resulting in the fluorocarbon plasma being deposited as a plasma polymerized coating layer on the bonding surface of the base substrate. Power is supplied to the ICP coil 310 from the first electric power supply 309a at about 11 to about 17 kW, about 12 to about 16 kW, or about 13 to about 15 kW to produce plasma from polymer forming fluorine gas. Power is supplied to the chuck 308 from the second electric power supply 309b at about 1 to about 7 W/m$^2$, about 2 to about 7 W/m$^2$, or about 3 to about 5 W/m$^2$. The power supplied results in a self-bias in the chuck 308 of about 35 to about 65 V, about 40 to about 60 V, or about 45 to about 55 V. This self-bias allows for efficient buildup of the coating layer material on the base substrate while minimizing etching of the base substrate. The power bias supplied to the chuck 308 is about 1 to about 2 kV, about 1.2 to about 1.8 kV, or about 1.4 to about 1.6 kV. The coating layer preferably has an average thickness of about 0.1 to about 20 nm, about 0.5 to about 15 nm, or about 1 to about 10 nm. The base substrate can be exposed to fluorocarbon plasma from about 0.5 to about 10 seconds, or about 1 to about 7 seconds.

After deposition of the coating layer, the third vacuum pump 304 is operated to remove the polymer forming gas, plasma and any residual gases from the process chamber

301. After optional surface treatment of the coating layer, as described in more detail below, third door 302 is opened and the base substrate with the deposited coating layer thereon is transferred from the process chamber 301 to the transfer chamber 201, remaining under vacuum. The third door 302 is shut, the second door 202 is opened, and the base substrate with coating layer is transferred from the transfer chamber 201 to the load lock chamber 101, remaining under vacuum. The second door 202 is closed, the first door 101 is opened, and the base substrate with coating layer is returned to standard temperature and pressure conditions. Alternatively, the substrate may leave the process chamber 301 by another path having another transfer chamber and another load lock chamber similar to those described above with respect to transfer module 200 and load lock module 100.

Surface Energy of the Coating Layer

As referred to herein, the surface energy of the coating layer is a measure of the surface energy of the exposed surface of the coating layer (for example, the bonding surface) as it exists on the base substrate. The coating layer can provide a bonding surface with a surface energy in a range of from about 48 to about 75 mJ/m$^2$, as measured for one surface (including polar and dispersion components), whereby the surface produces non-permanent bonding with another substrate.

In general, the surface energy of the coating layer can be measured upon being deposited and/or further treated. The surface energy of the as-deposited coating layer (after deposition of the layer and without any further treatments applied to the layer), prior to any further surface activation step, is typically in the range of about 48 to about 60 mJ/m$^2$, or about 50 to about 58 mJ/m$^2$, or equal to or greater than about 50 mJ/m$^2$, or equal to or less than about 60 mJ/m$^2$. After further treatment, for example, the surface energy can be increased to about 75 mJ/m$^2$ or less, which provides a self-propagating bond with a glass sheet, whereby production time to assemble articles is made reasonable and cost efficient. Both surface energy ranges (as-deposited and after having been further treated) can also be effective to control bonding at high temperatures so as to prevent two sheets from becoming permanently bonded to one another.

The surface energy of the solid surface can be measured indirectly by measuring the static contact angles of three liquids—water, diiodomethane and hexadecane—individually deposited on the solid surface in air. Surface energies as disclosed herein were determined according to the Wu model. (See: S. Wu, J. Polym. Sci. C, 34, 19, 1971). In the Wu model, the surface energies, including total, polar, and dispersion components, are measured by fitting a theoretical model to three contact angles of three test liquids: water, diiodomethane and hexadecane. From the contact angle values of the three liquids, a regression analysis is done to calculate the polar and dispersion components of the solid surface energy. The theoretical model used to calculate the surface energy values includes the following three independent equations relating the three contact angle values of the three liquids and the dispersion and polar components of surface energies of the solid surface (denoted by the subscript "S") as well as the three test liquids:

$$\gamma_W(1 + \cos\theta_W) = 4\left(\frac{\gamma_W^d \gamma_S^d}{\gamma_W^d + \gamma_S^d} + \frac{\gamma_W^p \gamma_S^p}{\gamma_W^p + \gamma_S^p}\right) \quad (1)$$

$$\gamma_D(1 + \cos\theta_D) = 4\left(\frac{\gamma_D^d \gamma_S^d}{\gamma_D^d + \gamma_S^d} + \frac{\gamma_D^p \gamma_S^p}{\gamma_D^p + \gamma_S^p}\right) \quad (2)$$

$$\gamma_H(1 + \cos\theta_H) = 4\left(\frac{\gamma_H^d \gamma_S^d}{\gamma_H^d + \gamma_S^d} + \frac{\gamma_H^p \gamma_S^p}{\gamma_H^p + \gamma_S^p}\right) \quad (3)$$

where, the subscripts "W", "D" and "H" represent water, diiodomethane and hexadecane, respectively, and the superscripts "d" and "p" represent dispersion and polar components of surface energies, respectively. Because diiodomethane and hexadecane are essentially non-polar liquids, the above set of equations reduces to:

$$\gamma_W(1 + \cos\theta_W) = 4\left(\frac{\gamma_W^d \gamma_S^d}{\gamma_W^d + \gamma_S^d} + \frac{\gamma_W^p \gamma_S^p}{\gamma_W^p + \gamma_S^p}\right) \quad (4)$$

$$\gamma_D(1 + \cos\theta_D) = 4\left(\frac{\gamma_D^d \gamma_S^d}{\gamma_D^d + \gamma_S^d}\right) \quad (5)$$

$$\gamma_H(1 + \cos\theta_H) = 4\left(\frac{\gamma_H^d \gamma_S^d}{\gamma_H^d + \gamma_S^d}\right) \quad (6)$$

From the above set of three equations (4-6), the two unknown parameters, dispersion and polar surface energy components of the solid surface, $\gamma_s^d$ and $\gamma_s^p$ can be calculated by regression analysis. However, with this approach, there is a limiting maximum value up to which the surface energy of the solid surface could be measured. That limiting maximum value is the surface tension of water, which is 73 mJ/m$^2$. If the surface energy of the solid surface is appreciably greater than the surface tension of water, the surface will be fully wetted by water, thereby rendering the contact angle to approach zero. Beyond this value of surface energy, therefore, all calculated surface energy values would correspond to about 73-75 mJ/m$^2$ regardless of the real surface energy value. For example, if the real surface energies of two solid surfaces are 75 mJ/m$^2$ and 150 mJ/m$^2$, the calculated values using the liquid contact angles will be about 75 mJ/m$^2$ for both surfaces.

Accordingly, all contact angles disclosed herein are measured by placing liquid droplets on the solid surface in air and measuring the angle between the solid surface and the liquid-air interface at the contact line. Therefore, when a claim is made on the surface energy value being from 40 mJ/m$^2$ to 75 mJ/m$^2$ it should be understood that these values correspond to calculated surface energy values based on the method described above and not the real surface energy values, which could be greater than 75 mJ/m$^2$ when the calculated value approaches the real surface energy value.

After the coating layer is deposited, it can optionally be annealed. The annealing can serve to remove partially polymerized materials in the coating layer. This removal can significantly decrease outgassing of the coating layer, for example, during processing of the first substrate and second substrate at elevated temperatures. This decrease in outgassing can lead to a stronger bond at elevated temperatures, which allows for more successful processing of the substrates. The annealing can take place in a Rapid Thermal Processing system (RTP). The annealing can be at temperature above 100° C., for example above 200° C., above 300° C., above 400° C., above 500° C., above 600° C., or above 700° C. The annealing can occur in atmosphere including, for example, nitrogen, oxygen, or air. The annealing can be for 15 seconds or more, for example 30 seconds or more, 45 seconds or more, 1 minute or more, 2 minutes or more, 3 minutes or more, 4 minutes or more, at 5 minutes or more, 6 minutes or more, 7 minutes or more, 8 minutes or more, 9 minutes or more, or 10 minutes or more. The time and temperature for the annealing may vary depending upon the composition of the coating layer.

Surface Treatment of Coating Layer

After the deposition of a coating layer in the processing module, the surface of the coating layer can be treated inside the process module to achieve more desirable properties for bonding with a second substrate. Feeding a treatment gas, such as nitrogen, through the gas supply inlet while powering the ICP coil to produce treatment gas plasma can increase the surface energy of the coating layer to more desirable levels for bonding with a second substrate. Additionally, powering the chuck during treatment with a treatment gas plasma can result in fluorine atoms in the coating layer being pushed through drift toward the coating layer-base substrate interface, which can also increase the surface energy of the bonding surface of the coating layer to more desirable levels for bonding with a second substrate. In some embodiments, the surface roughness of the coating layer after treatment is less than about 0.7 nm, less than about 0.6 nm, or less than about 0.5 nm. The bonding surface of the coating layer after treatment has an atomic surface concentration of fluorine of less than 40%, less than 35%, less than 30%, less than 25%, less than 20%, or less than 15%.

After surface treatment, the treated substrate can be removed by moving from the process module to the transfer module to the load lock module and finally out of the system.

In an example surface treatment, after deposition of a coating layer and removal of coating layer gas via third vacuum pump 304 or by purging the process module, a treatment gas is introduced to the process chamber 301 from third gas source 306b through third gas supply inlet 305. The chamber walls 303 and chuck 308 are maintained at the same temperature as during the deposition of the coating layer, for example, at about 60° C. or above. Electric power is supplied to the ICP coil 310, generating treatment gas plasma, as well as to the chuck 308, generating a charge in the chuck that attracts the treatment gas plasma toward the chuck 308, resulting in the treatment gas plasma raising the surface energy of the bonding surface of the coating layer on the base substrate. Power is supplied to the ICP coil 310 from the first electric power supply 309a at about 11 to about 17 kW, about 12 to about 16 kW, or about 13 to about 15 kW to produce plasma from gas. Power is supplied to the chuck 308 from the second electric power supply 309b at about 50 to about 140 $W/m^2$, about 55 to about 135 $W/m^2$, or about 60 to about 130 $W/m^2$. The power supplied results in a self-bias in the chuck 308 of about 150 to about 250 V, about 170 to about 230 V, or about 190 to about 210 V. This self-bias results in fluorine atoms in the coating layer to move, through drift, toward the base substrate without resulting in treatment gas plasma having too much energy such that it destroys the coating layer via physical bombardment. Thus, the elevated self-bias (e.g., above 150 to 200 V) allows the fluorine preset in the coating layer to react and bind with the base substrate surface interface to provide a buildup of carbon-based material or a film on the bonding surface of the coating layer that is depleted of fluorine as compared to and not possible with lower self-bias treatments (e.g., less than 150, 125 or 100 V). The power bias supplied to the chuck 308 is about 1 to about 2 kV, about 1.2 to about 1.8 kV, or about 1.4 to about 1.6 kV. The exposure of the coating layer to treatment gas plasma can be from about 0.5 to about 10 seconds, preferably about 1 to about 9.5 second, about 2 to about 9 seconds, or about 2.5 to about 8.5 seconds. After surface treatment of the coating layer, the third vacuum pump 304 is operated to remove the gas, plasma and residual gases from the process chamber 301. Then, as described above, third door 302 is opened and the base substrate with surface treated coating layer is transferred from the process chamber 301 to the transfer chamber 201, remaining under vacuum. The third door 302 is shut, the second door 202 is opened, and the base substrate with surface treated coating layer is transferred from the transfer chamber 201 to the load lock chamber 101, remaining under vacuum. The second door 202 is closed, the first door 101 is opened, and the base substrate with surface treated coating layer is returned to standard temperature and pressure conditions.

Figure 4:
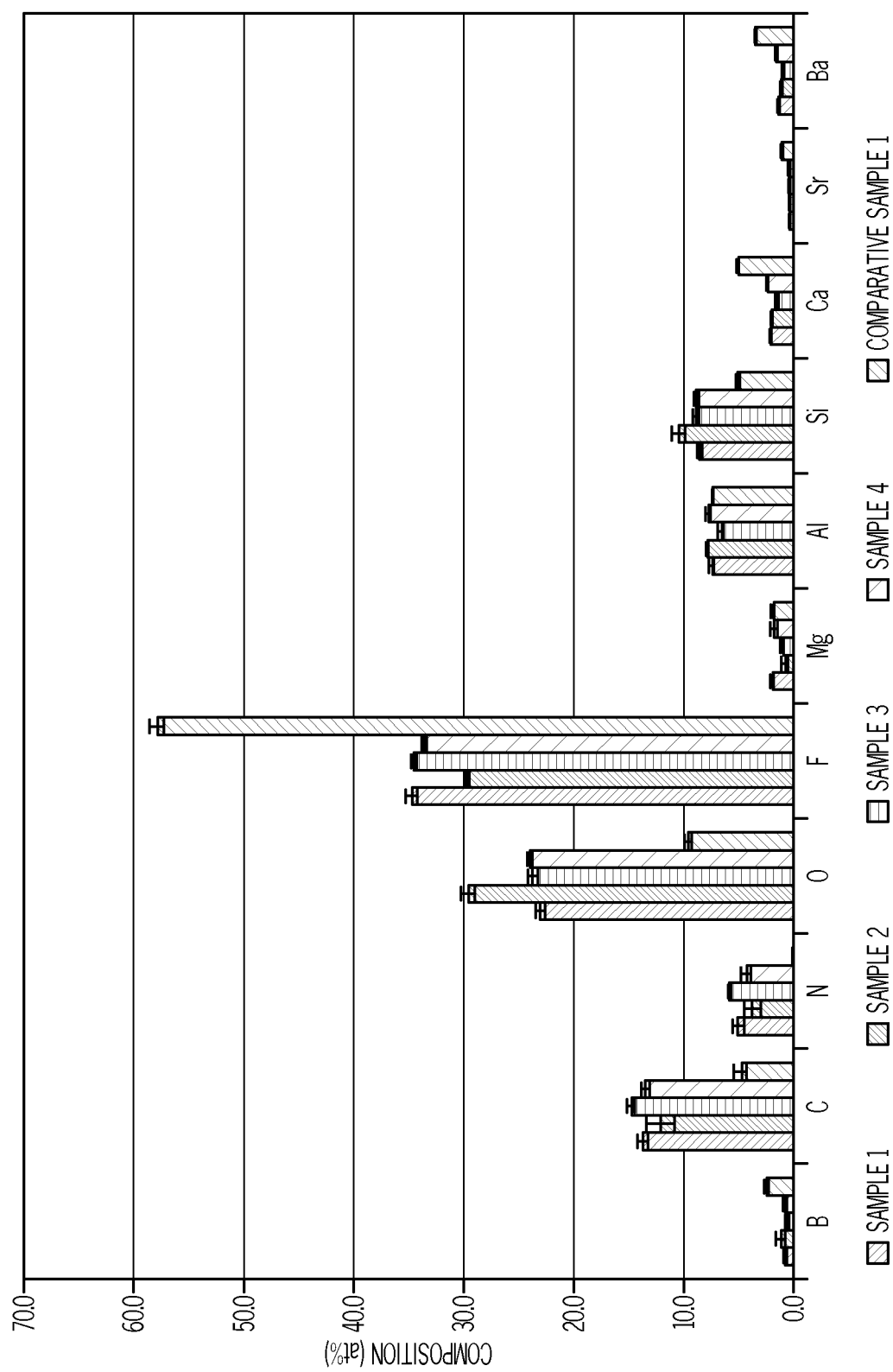
FIG. 4 is a graph of the surface composition of the bonding surface of coating layers deposited on a base substrate.

FIG. 4 shows the surface composition on the atomic level of five samples of the exposed bonding surface of the coating layers deposited on base substrates. Samples 1-4 were prepared and surface treated using the process described in Example 1, whereas comparative sample 1 was prepare and surface treated using the process described in Comparative Example 1. As can be seen in FIG. 4, the atomic surface concentration of fluorine in samples 1-4 is between about 30 and about 35%, whereas that of comparative sample 1 is near 60%. Additionally, the atomic surface concentration of carbon is between about 10 and about 15% in samples 1-4, whereas that of comparative sample 1 is near 5%. The atomic surface concentration of nitrogen is near 5% in samples 1-4, whereas that of comparative sample 1 is near 0%. Moreover, the atomic surface concentration of oxygen is between about 20 and about 30% in samples 1-4, whereas that of comparative sample 1 is near 10%. The atomic surface concentration of silicon is between about 8 and about 12%, whereas that of comparative sample 1 is near 5%. It can be seen that the method for treating a substrate as described herein can result in a fluorine concentration at the bonding surface of a coating layer of less than 40, 35 and 30%. The reduced surface fluorine concentration provides a bondable surface that promotes debondable attachments of second substrates after exposing the article to a temperature of 750° C. for 10 minutes.

Figure 5:
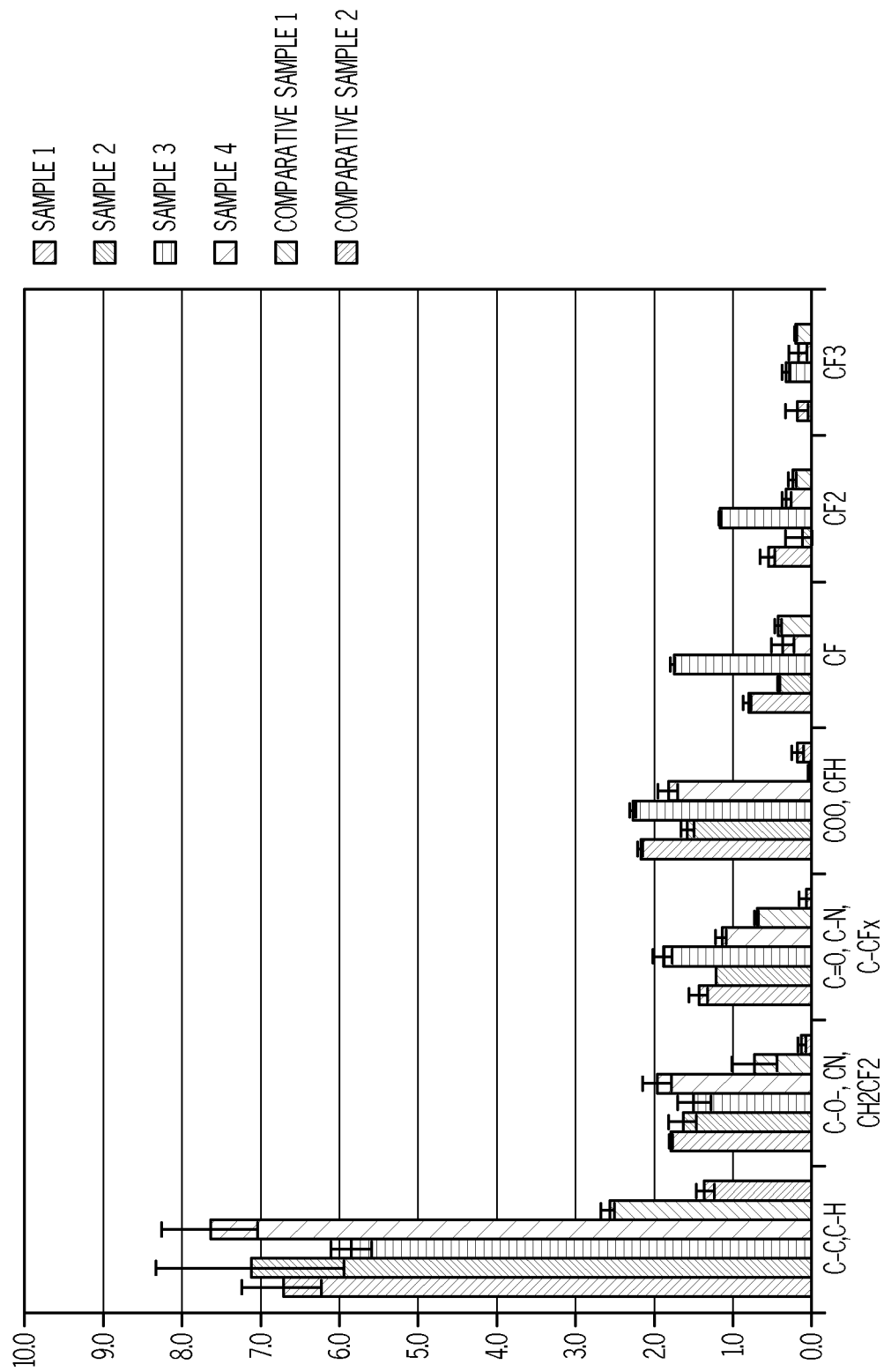
FIG. 5 is a graph of the surface composition of carbon species of the bonding surface of coating layers deposited on a base substrate.

FIG. 5 shows the surface composition of carbon species on the atomic level of five samples of the exposed bonding surface of the coating layers on base substrates, and one base substrate without a coating layer (comparative sample 2). Samples 1-4 were prepared and surface treated using the process described in Example 1, whereas comparative sample 1 was prepared and surface treated using the process described in Comparative Example 1. As can be seen in FIG. 5, the atomic surface concentration of C—C and C—H species is between about 5.8 and about 8% in samples 1-4, whereas that of comparative sample 1 is near 2.5% and that of comparative sample 1 is about 1.25%. The atomic surface concentration of C—O, C—N, and $CH_2$—$CF_2$ species is between about 1.5 and about 2% for samples 1-4, whereas that of comparative sample 1 is about 0.75% and that of comparative sample 2 is about 0.4%. Additionally, the atomic surface concentration of C=O, C—N, and C—$CF_x$ species is between about 1 and about 2% for samples 1-4, whereas that of comparative sample 1 is about 0.75% and that of comparative sample 2 is near 0%. Moreover, the atomic surface concentration of COO and CFH species is between about 1.5 and about 2.25% in samples 1-4, whereas that of comparative sample 1 is near 0% and that of comparative sample 2 is near 0.1%. It can be seen that the carbon concentration at the bonding surface of the coating layer is significantly increased by the methods described herein. The increased carbon concentration at the bonding surface of the coating layer further evidences that reduced amounts of fluorine are present at the surface, which is advantageous for making glass articles that are debondable at elevated temperatures, e.g., above 600° C.

Bonding Energy of the Base Substrate or Second Substrate to the Coating Layer

As referred to herein, the bond energy of the coating layer is a measure of the force coupling the base and second substrates. In general, the energy of adhesion (i.e., bond energy) between two surfaces can be measured by a double cantilever beam method or wedge test. The tests simulate in a qualitative manner the forces and effects on an adhesive bond joint at the interface between a coating layer and a base substrate or a coating layer and a second substrate. Wedge tests are commonly used for measuring bonding energy. For example, ASTM D5041, Standard Test Method for Fracture Strength in Cleavage of Adhesives in Bonded Joints, and ASTM D3762, Standard Test Method for Adhesive-Bonded Surface Durability of Aluminum, are standard test methods for measuring bonding of substrates with a wedge.

As an example, a summary of the test method for determining bond energies as disclosed herein, based on the above-noted ASTM methods, is described here. The test method can include recording the temperature and relative humidity under which the testing is conducted, for example, that in a lab room. The second substrate (or sheet) is gently pre-cracked or separated at a corner of the glass article to break the bond between the base substrate and the second substrate. A razor blade is used to pre-crack the second substrate from the base substrate, for example a GEM brand razor, wherein the razor has a thickness of about 95 microns. In forming the pre-crack, momentary sustained pressure is used to fatigue the bond. A flat razor having the aluminum tab removed is slowly inserted until the crack front can be observed to propagate such that the crack and separation increases. The flat razor does not need to be inserted significantly to induce a crack. Once a crack is formed, the glass article is permitted to rest for at least 5 minutes to allow the crack to stabilize. Longer rest times are used for high humidity environments, for example, above 50% relative humidity.

The glass article with the developed crack is evaluated with a microscope to record the crack length. The crack length is measured from the end separation point of the second substrate from the base substrate (i.e. furthest separation point from the tip of razor) and the closest non-tapered portion of the razor. The crack length is recorded and used in the following equation to calculate bond energy.

$$\gamma = 3 t_b^2 E_1 t_{w1}^3 E_2 t_{w2}^3 / 16 L^4 (E_1 t_{w1}^3 + E_2 t_{w2}^3) \quad (7)$$

wherein $\gamma$ represents the bond energy, $t_b$ represents the thickness of the blade, razor or wedge, $E_1$ represents the Young's modulus of the base substrate (e.g., a glass carrier), $t_{w1}$ represents the thickness of the base substrate, $E_2$ represents the Young's modulus of the second substrate (e.g., a glass sheet), $t_{w2}$ represents the thickness of the second substrate and L represents the crack length between the base substrate and second substrate upon insertion of the razor blade as described above.

The bond energy is understood to behave as in silicon wafer bonding, where an initially hydrogen bonded pair of wafers are heated to convert much or all the silanol-silanol hydrogen bonds to Si—O—Si covalent bonds. While the initial room temperature hydrogen bonding produces bond energies on the order of about 100-200 mJ/m² which allows separation of the bonded surfaces, a fully covalently bonded wafer pair as achieved during processing on the order of about 300 to about 800° C. has an adhesion energy of about 2000 to about 3000 mJ/m², which does not allow separation of the bonded surfaces; instead, the two wafers act as a monolith. On the other hand, if both the surfaces are perfectly coated with a low surface energy material, for example a fluoropolymer, with a thickness large enough to shield the effect of the underlying substrate, the adhesion energy would be that of the coating material and would be very low, leading to low or no adhesion between the bonding surfaces. Accordingly, the second substrate would not be able to be processed on the base substrate without failure of the bond and potential damage to the second substrate. Consider two extreme cases: (a) two standard clean 1 (SC1, as known in the art) cleaned glass surfaces saturated with silanol groups bonded together at room temperature via hydrogen bonding (whereby the adhesion energy is about 100 to about 200 mJ/m²) followed by heating to a temperature that converts the silanol groups to covalent Si—O—Si bonds (whereby the adhesion energy becomes about 2000 to about 3000 mJ/m²). This latter adhesion energy is too high for the pair of glass surfaces to be detachable; and (b) two glass surfaces perfectly coated with a fluoropolymer with low surface adhesion energy (about 12 to about 20 mJ/m² per surface) bonded at room temperature and heated to high temperature. In this latter case (b), not only do the surfaces not bond at low temperature (because the total adhesion energy of from about 24 to about 40 mJ/m², when the surfaces are put together, is too low), they do not bond at high temperature either as there are too few polar reacting groups. Between these two extremes, a range of adhesion energies exist, for example between about 50 to about 1000 mJ/m², which can produce a more desired degree of bonding. Accordingly, the inventors have found various methods of providing a coating layer leading to a bonding energy between these two extremes, and such that there can be produced a controlled bonding sufficient to maintain a pair of glass substrates (for example a glass carrier and a glass sheet) bonded to one another through the rigors of TFT or LTPS processing but also of a degree that (even after high temperature processing of, e.g. ≥400° C. to 750° C.) allows the detachment of the second substrate from the base substrate after processing is complete. Moreover, the detachment of the second substrate from the base substrate can be performed by mechanical forces, and in such a manner that there is no significant damage to at least the second substrate, and preferably also so that there is no significant damage to the base substrate.

An appropriate bonding energy can be achieved by using select surface modifiers, i.e., coating layer, and/or deposition methods and thermal treatment of the surfaces prior to bonding. The appropriate bonding energy may be attained by the choice of chemical modifiers of either one or both of bonding surface 14 and bonding surface 24, which chemical modifiers control both the van der Waals (and/or hydrogen bonding, as these terms are used interchangeably throughout the specification) adhesion energy as well as the likely covalent bonding adhesion energy resulting from high temperature processing (e.g., on the order of ≥400° C. to 750° C.).

Production of the Article

In order to produce the article, the coating layer is formed on a base substrate, for example, the base substrate 10. As described herein, if desired, the coating layer can be subjected to steps such as surface activation in order increase the surface energy, deplete fluorine from the surface and decrease outgassing during processing and improve the bonding capabilities of the coating layer. In order to bond a second substrate, e.g., a second sheet, the second substrate is brought into contact with the exposed bonding surface of the coating layer. If the coating layer has a high enough surface energy, introducing the second substrate to the coating layer will result in the second substrate being bonded to the coating layer via a self-propagating bond. Self-propagating bonds are advantageous in reducing assembly time and/or cost. However, if a self-propagating bond does not result, the second substrate can be bonded to the coating layer using additional techniques, such as lamination, for example by pressing the sheets together with rollers, or by other techniques, as known in the lamination art for bringing two pieces of material together for bonding.

Thermal Testing of Bond Energy

The bonding energy of the coating layers to substrates or sheets was tested after specific heating conditions ("Bond Energy test"). To see whether a particular surface coating layer would allow a sheet to remain bonded to a carrier and still allow the sheet to be debonded from the carrier after processing, the following test was carried out. The article (sheet bonded to the carrier via the coating layer, or second substrate bonded to substrate via the coating layer) was put in a furnace or a Rapid Thermal Processing (RTP) that ramped to the desired processing-test temperature at a rate of 4° C. per second. The article was then held in the furnace (maintained at the desired processing-test temperature) for 10 minutes. The furnace was then cooled to about 150° C. in 45 minutes, and the sample was pulled. The article was then tested for bond energy according to the Bond Energy test set forth herein.

After room temperature bonding, the article is then thermally tested to see how the bond energy will increase after thermal processing by using the above-described thermal testing of bond energy. In some examples, the coating layer can have a bonding surface bonded to the base substrate or second substrate with bond energy of equal to or less than 900 mJ/m$^2$, equal to or less than 850 mJ/m$^2$, equal to or less than 800 mJ/m$^2$, equal to or less than 750 mJ/m$^2$, equal to or less than 700 mJ/m$^2$, equal to or less than 650 mJ/m$^2$, equal to or less 600 mJ/m$^2$, equal to or less 550 mJ/m$^2$, or equal to or less than 500 mJ/m$^2$, including any ranges and subranges therebetween, after holding the article in a furnace at a temperature of 500° C., 550° C., 600° C., 650° C., 700° C., 750° C., including any ranges and subranges therebetween, for 10 minutes in an inert gas (e.g., nitrogen) atmosphere. Bond energy as used herein is measured after placing an article in a furnace chamber, heating the furnace at a rate of 9° C. per minute to the test temperature (e.g., 600° C.), holding the article at the test temperature for a period of 10 minutes, preferably in an inert atmosphere (e.g., nitrogen), cooling the chamber of the furnace to about 200° C. over a period of time of about 1 minute, and then removing the article from the furnace chamber and allowing it to cool to room temperature. This process of testing the articles can also be referred to as subjecting the articles to a thermal test cycle.

Debonding of the Coating Layer

The coating layer described herein allows the second substrate to be separated from the base substrate without breaking the second substrate into two or more pieces after the glass article is subjected to the above temperature cycling and thermal testing.

Processing of the Glass Article

The use of a modified coating layer, together with bonding surface preparation described herein, can achieve a controlled bonding area, that is, a bonding area capable of providing a room-temperature bond between the base substrate and the second substrate sufficient to allow the article to be processed in FPD type processes (including vacuum and wet processes), and yet one that controls covalent bonding between the base substrate and the second substrate (even at elevated temperatures) so as to allow the base substrate to be removed from the second substrate (without damage to the substrates) after high temperature processing of the article, for example, FPD type processing or LTPS processing. To evaluate potential bonding surface preparations and coating layers with various bonding energies that would provide a reusable carrier suitable for FPD processing, a series of tests were used to evaluate the suitability of each. Different FPD applications have different requirements, but LTPS and Oxide TFT processes appear to be the most stringent at this time. Thus, tests representative of steps in these processes were chosen, as these are desired applications for the article 2. Annealing at 400° C. is used in oxide TFT processes, whereas crystallization and dopant activation steps over 600° C. are used in LTPS processing. Accordingly, the following testing was carried out to evaluate the likelihood that a particular bonding surface preparation and the coating layer would allow a second substrate to remain bonded to a base substrate throughout FPD processing, while allowing the second substrate to be removed from the base substrate (without damaging the second substrate and/or the base substrate) after such processing (including processing at temperatures≥400° C. to 750° C.

EXAMPLES

Example 1

In a process chamber having a gas supply inlet coupled to an ICP coil coupled to a first electric power supply and a chuck connected to a second independent electric power supply, a carrier (glass having a thickness of 0.5 mm and a nominal composition of—in weight percent—$SiO_2$ 61.5, $Al_2O_3$ 19.7, $B_2O_3$ 1.7, MgO 2.5, CaO 4.5, SrO 1.8, BaO 8.1, $SnO_2$ 0.2, $Fe_2O_3$ 0.03, $ZrO_2$ 0.03) was placed on the chuck. With the ICP coil power set at 14 kW, $CHF_3$ was delivered into the reactor chamber through the gas supply inlet and ICP coil at a flow rate of 1250 sccm and a pressure of about 8 to about 10 mTorr (about 10 mTorr for sample 1; about 8.2 mTorr for sample 2; about 9.2 mTorr for sample 3; and about 10 mTorr for sample 4). The reaction chamber only contained the polymer forming fluorine gas. The chuck bias power was set at 125 W with the power bias being 1.5 kV, resulting in a self-bias of about 50 V. The walls of the reactor chamber were kept at 60° C. while the chuck was kept at 40° C. The $CHF_3$ plasma over a processing time of less than about 7 seconds (about 6.5 seconds for sample 1; about 1.2 seconds for sample 2; about 1 second for sample 3; and about 3 seconds for sample 4) deposited a thin fluorocarbon polymer coating layer on the carrier having a thickness less than 2 nm. After the coating layer deposition, the reactor chamber was pumped and purged of the gas/plasma several times using a vacuum pump. With the ICP coil power again set at 14 kW, $N_2$ was delivered into the reactor chamber through the gas supply inlet and ICP coil at a flow rate of 1250 sccm and a pressure of about 8 to about 10 mTorr (about 10 mTorr for sample 1; about 8.2 mTorr for sample 2; about 9.2 mTorr for sample 3; and about 10 mTorr for sample 4) in the reaction chamber. The chuck bias power was set at 2182 to 4240 W with the power bias being 1.5 kV, resulting in a self-bias in the range of about 150 to 250 V.

The walls of the reactor chamber were kept at 60° C. while the chuck was kept at 40° C. The $N_2$ plasma treatment and self-bias of the chuck over a processing time of less than about 8 seconds (about 6.5 seconds for sample 1; about 2.8 seconds for sample 2; about 2.3 seconds for sample 3; and about 8 seconds for sample 4) resulted in the F atoms on the exposed surface of the coating layer to drift toward the carrier/coating layer interface and treating the coating layer surface to a roughness of ≤0.4 nm, surface energy of about 74 mJ/m2, a F content of <30% and a Si content of >10%. The bonding surface of the coating layer depleted of fluorine was then bonded with a glass sheet (glass having a thickness of 0.1 mm and a nominal composition of—in weight percent—$SiO_2$ 62.0, $Al_2O_3$ 18.3, $B_2O_3$ 4.2, MgO 2.2, CaO 4.2, SrO 1.8, BaO 7.0, $SnO_2$ 0.2, $Fe_2O_3$ 0.02, $ZrO_2$ 0.02) to form a glass article. After annealing the glass article at 600° C. for 10 min in air, the bond energy was between 500 and 600 $mJ/m^2$. The carrier and glass sheet of the glass article were separable without breakage.

Comparative Example 1

In a process chamber having a gas supply inlet coupled to an ICP coil coupled to a first electric power supply and a chuck connected to a second independent electric power supply, a carrier (glass having a thickness of 0.5 mm and a nominal composition of—in weight percent—$SiO_2$ 61.5, $Al_2O_3$ 19.7, $B_2O_3$ 1.7, MgO 2.5, CaO 4.5, SrO 1.8, BaO 8.1, $SnO_2$ 0.2, $Fe_2O_3$ 0.03, $ZrO_2$ 0.03) was placed on the chuck. With the ICP coil power set at 10 kW, $CF_4$ was delivered into the reactor chamber through the gas supply inlet and ICP coil at a flow rate of 500 sccm and a pressure of about 7 mTorr. The reaction chamber only contained the polymer forming fluorine gas. The chuck bias power was set at 2000 W with the power bias being 1.5 kV, resulting in a self-bias of about 141 V. The walls of the reactor chamber were kept at 60° C. while the chuck was kept at 40° C. The $CF_4$ plasma over a processing time of about 30 seconds deposited a thin fluorocarbon polymer coating layer on the carrier having a thickness less than 2 nm. After the coating layer deposition, the reactor chamber was pumped and purged of the gas/plasma several times using a vacuum pump. With the ICP coil power again set at 10 kW, in order to treat the surface of the coating layer, $CF_4$ and $CHF_3$ were delivered into the reactor chamber through the gas supply inlet and ICP coil at flow rates of 937.5 and 312.5 sccm, respectively, and a pressure of about 30 mTorr in the reaction chamber. The chuck bias power was set at 3000 W with the power bias being 1.5 kV, resulting in a self-bias of about 190 V. The walls of the reactor chamber were kept at 60° C. while the chuck was kept at 40° C. The $CF_4$ and $CHF_3$ plasma treatment had a processing time of about 45 seconds. The bonding surface of the coating layer was then bonded with a glass sheet (glass having a thickness of 0.1 mm and a nominal composition of—in weight percent—$SiO_2$ 62.0, $Al_2O_3$ 18.3, $B_2O_3$ 4.2, MgO 2.2, CaO 4.2, SrO 1.8, BaO 7.0, $SnO_2$ 0.2, $Fe_2O_3$ 0.02, $ZrO_2$ 0.02) to form a glass article. After annealing the glass article at 600° C. for 10 min in air, the glass article did not work very well.

What is claimed is:

1. A method for treating a substrate surface comprising the steps of:
    a. arranging a base substrate on a chuck in a reaction chamber, the reaction chamber comprising an inductively coupled plasma coil and a gas supply inlet, the chuck and inductively coupled plasma coil being independently connected to an electric power supply;
    b. supplying a polymer forming fluorine gas source to the gas supply inlet and flowing the polymer forming fluorine gas source into the reaction chamber to contact the substrate arranged on the chuck, the polymer forming fluorine gas source comprising a fluorine component of the formula $C_xH_zF_y$, wherein x is selected from 1-4, y is selected from 3-8, and z is selected from 0-3, wherein when x is 1 then y is 3 and z is 1;
    c. supplying electric power to the inductively coupled plasma coil and the chuck wherein the chuck operates at a self-bias of less than 60 V;
    d. depositing a carbon-based material derived from the polymer forming fluorine gas source to form a coating layer on the substrate;
    e. exposing the deposited coating layer to a treatment gas to form a treated coated substrate; and
    f. removing the treated coated substrate from the reaction chamber.

2. The method of claim 1, the carbon-based material comprising a plasma-polymerized fluoropolymer.

3. The method of claim 2, the plasma-polymerized fluoropolymer comprising an atomic surface concentration of fluorine of less than 15%.

4. The method of claim 1, the polymer forming fluorine gas source being selected from the group consisting of $CHF_3$, $C_2F_4$, $C_3F_8$, $C_4F_8$, and any combination thereof.

5. The method of claim 1, the polymer forming fluorine gas source being free of an etching gas.

6. The method of claim 5, the etching gas comprising at least one of $CF_4$, $SF_6$, $NF_3$, and any combination thereof.

7. The method of claim 1, the coating layer comprising an average thickness in the range of 1 to 10 nm.

8. The method of claim 1, the coating layer being a monolayer.

9. The method of claim 1, the base substrate being glass comprising a thickness of 300 microns or less.

10. The method of claim 1, the reaction chamber comprising an internal pressure less than 30 Torr during the step of depositing the carbon-based material.

11. The method of claim 1, step c comprising supplying the chuck with electric power at 3 to 5 $W/m^2$.

12. The method of claim 1, the treatment gas comprising at least one of nitrogen, oxygen, hydrogen, carbon dioxide gas, and a combination thereof.

13. The method of claim 1, the chuck operating at a self-bias in the range of 150 V to 250 V during exposure of the deposited coating layer to treatment gas.

14. The method of claim 1, the deposited coating layer being exposed to the treatment gas for 0.5 to 10 seconds.

15. The method of claim 1, the coating layer of the treated coated substrate comprising a bonding surface.

16. The method of claim 15, the bonding surface comprising an atomic surface concentration of fluorine of less than 40%.

17. The method of claim 15, the coating layer comprising a surface roughness less than 0.5 nm.

18. The method of claim 15, the bonding surface comprising an atomic surface concentration of fluorine of less than 30%.

19. The method of claim 15, the bonding surface comprising an atomic surface concentration of silicon of greater than 5%.

* * * * *

UNITED STATES PATENT AND TRADEMARK OFFICE
CERTIFICATE OF CORRECTION

| | |
|---|---|
| PATENT NO. | : 11,331,692 B2 |
| APPLICATION NO. | : 16/771044 |
| DATED | : May 17, 2022 |
| INVENTOR(S) | : Kaveh Adib et al. |

It is certified that error appears in the above-identified patent and that said Letters Patent is hereby corrected as shown below:

On the Title Page

On the page 5, in item (56), in Column 2, under "Other Publications", Line 2, delete "Cyloaddtion";" and insert -- Cycloaddition"; --.

On the page 5, in item (56), in Column 2, under "Other Publications", Line 7, delete "Perfluororelastomer" and insert -- Perfluoroelastomer --.

On the page 5, in item (56), in Column 2, under "Other Publications", Line 28, delete "Sllanes," and insert -- Silanes, --.

On the page 6, in item (56), in Column 1, under "Other Publications", Line 9, delete "Writien" and insert -- Written --.

On the page 6, in item (56), in Column 1, under "Other Publications", Line 12, delete "Writien" and insert -- Written --.

On the page 6, in item (56), in Column 1, under "Other Publications", Line 15, delete "Writien" and insert -- Written --.

On the page 6, in item (56), in Column 1, under "Other Publications", Line 18, delete "Writien" and insert -- Written --.

On the page 6, in item (56), in Column 1, under "Other Publications", Line 22, delete "Aurthority;" and insert -- (2013). --.

On the page 6, in item (56), in Column 2, under "Other Publications", Line 8, delete "Aurthority;" and insert -- (2013). --.

Signed and Sealed this
Eleventh Day of October, 2022

Katherine Kelly Vidal
*Director of the United States Patent and Trademark Office*

CERTIFICATE OF CORRECTION (continued)

U.S. Pat. No. 11,331,692 B2

On the page 6, in item (56), in Column 2, under "Other Publications", Line 12, delete "WO2014/'151353." and insert -- WO2014/151353. --.

On the page 6, in item (56), in Column 2, under "Other Publications", Line 32, delete "Irfrared" and insert -- Infrared. --.